(12) United States Patent
Jung et al.

(10) Patent No.: US 11,417,776 B2
(45) Date of Patent: Aug. 16, 2022

(54) SEMICONDUCTOR DEVICES

(71) Applicant: Samsung Electronics Co., Ltd., Suwon-si (KR)

(72) Inventors: Sujin Jung, Suwon-si (KR); Junbeom Park, Suwon-si (KR); Kihwan Kim, Suwon-si (KR); Sunguk Jang, Suwon-si (KR); Youngdae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 16/715,431

(22) Filed: Dec. 16, 2019

(65) Prior Publication Data

US 2020/0381562 A1 Dec. 3, 2020

(30) Foreign Application Priority Data

May 30, 2019 (KR) ........................ 10-2019-0063727

(51) Int. Cl.
  *H01L 29/06* (2006.01)
  *H01L 29/66* (2006.01)
  *H01L 29/423* (2006.01)
  *H01L 29/786* (2006.01)
  *H01L 21/02* (2006.01)

(52) U.S. Cl.
  CPC .. *H01L 29/78696* (2013.01); *H01L 21/02532* (2013.01); *H01L 21/02603* (2013.01); *H01L 21/02645* (2013.01); *H01L 29/0673* (2013.01); *H01L 29/42392* (2013.01); *H01L 29/66545* (2013.01); *H01L 29/66742* (2013.01); *H01L 29/78618* (2013.01)

(58) Field of Classification Search
  CPC ........... H01L 29/4983; H01L 29/78696; H01L 29/66545; H01L 21/823412
  See application file for complete search history.

(56) References Cited

U.S. PATENT DOCUMENTS

| | | | |
|---|---|---|---|
| 9,184,269 B2 | 11/2015 | Ching et al. | |
| 9,601,569 B1 | 3/2017 | Suk et al. | |
| 9,620,607 B2 | 4/2017 | Huang et al. | |
| 9,653,289 B1* | 5/2017 | Balakrishnan | ...... H01L 29/4983 |
| 9,741,810 B2 | 8/2017 | Ching et al. | |
| 10,008,583 B1 | 6/2018 | Rodder et al. | |

(Continued)

*Primary Examiner* — Brian Turner
(74) *Attorney, Agent, or Firm* — Muir Patent Law, PLLC

(57) ABSTRACT

A semiconductor device, including a silicon on insulator (SOI) substrate is disclosed. The device may include gate structures formed on the SOI substrate and being spaced apart from each other in a horizontal direction, and a plurality of channels spaced apart from each other in a vertical direction. Each of the channels may extend through each of the gate structures in the horizontal direction. The device may include a seed layer and a source/drain region. The source/drain region may be connected to the channels, and each sidewall of the source/drain region in the horizontal direction may have a concave-convex shape. The device may include a protruding portion of the source/drain region formed between the gate structures that protrudes in the horizontal direction compared to a non-protruding portion of the source/drain region formed between the channels.

17 Claims, 20 Drawing Sheets

(56) References Cited

U.S. PATENT DOCUMENTS

| | | | |
|---|---|---|---|
| 2011/0073842 A1* | 3/2011 | Liu | H01L 29/42392 |
| | | | 257/24 |
| 2014/0070316 A1* | 3/2014 | Chan | H01L 21/823412 |
| | | | 257/347 |
| 2017/0194429 A1* | 7/2017 | Guillorn | H01L 29/0673 |
| 2017/0222006 A1* | 8/2017 | Suh | H01L 29/0847 |
| 2017/0256609 A1* | 9/2017 | Bhuwalka | H01L 29/775 |
| 2017/0365604 A1* | 12/2017 | Suh | H01L 27/092 |
| 2018/0175167 A1* | 6/2018 | Reboh | H01L 21/823864 |
| 2018/0294331 A1 | 10/2018 | Cho et al. | |
| 2019/0058052 A1 | 2/2019 | Frougier et al. | |
| 2020/0006478 A1* | 1/2020 | Hsu | H01L 27/088 |
| 2020/0006577 A1* | 1/2020 | Ching | H01L 29/0673 |

* cited by examiner

FIG. 2
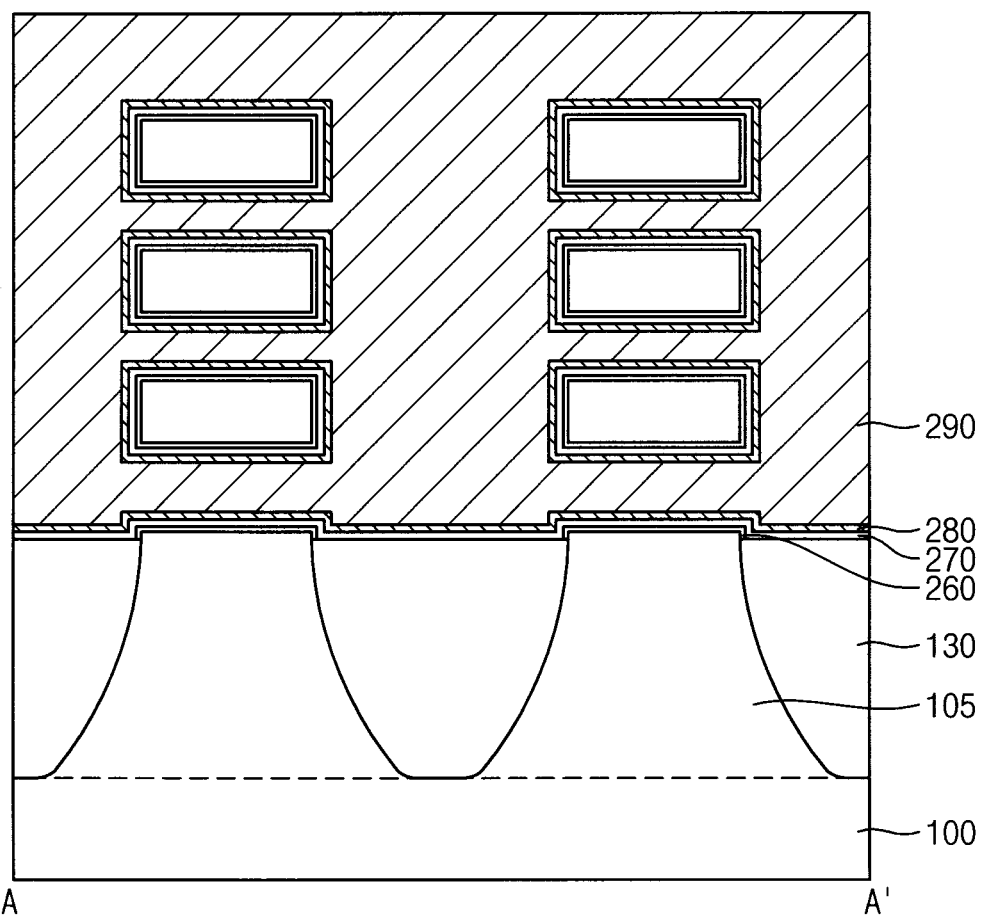
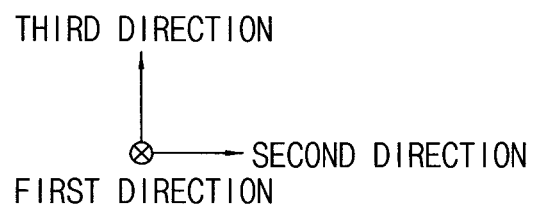

FIG. 5
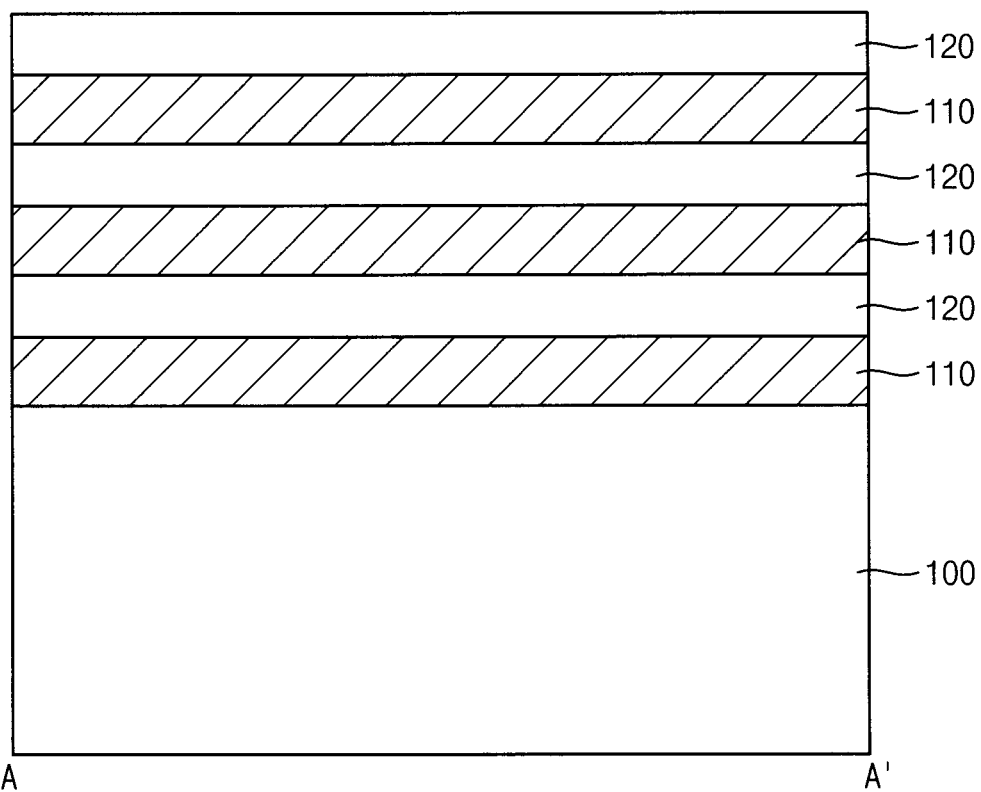
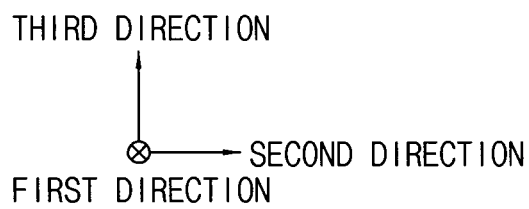

FIG. 15
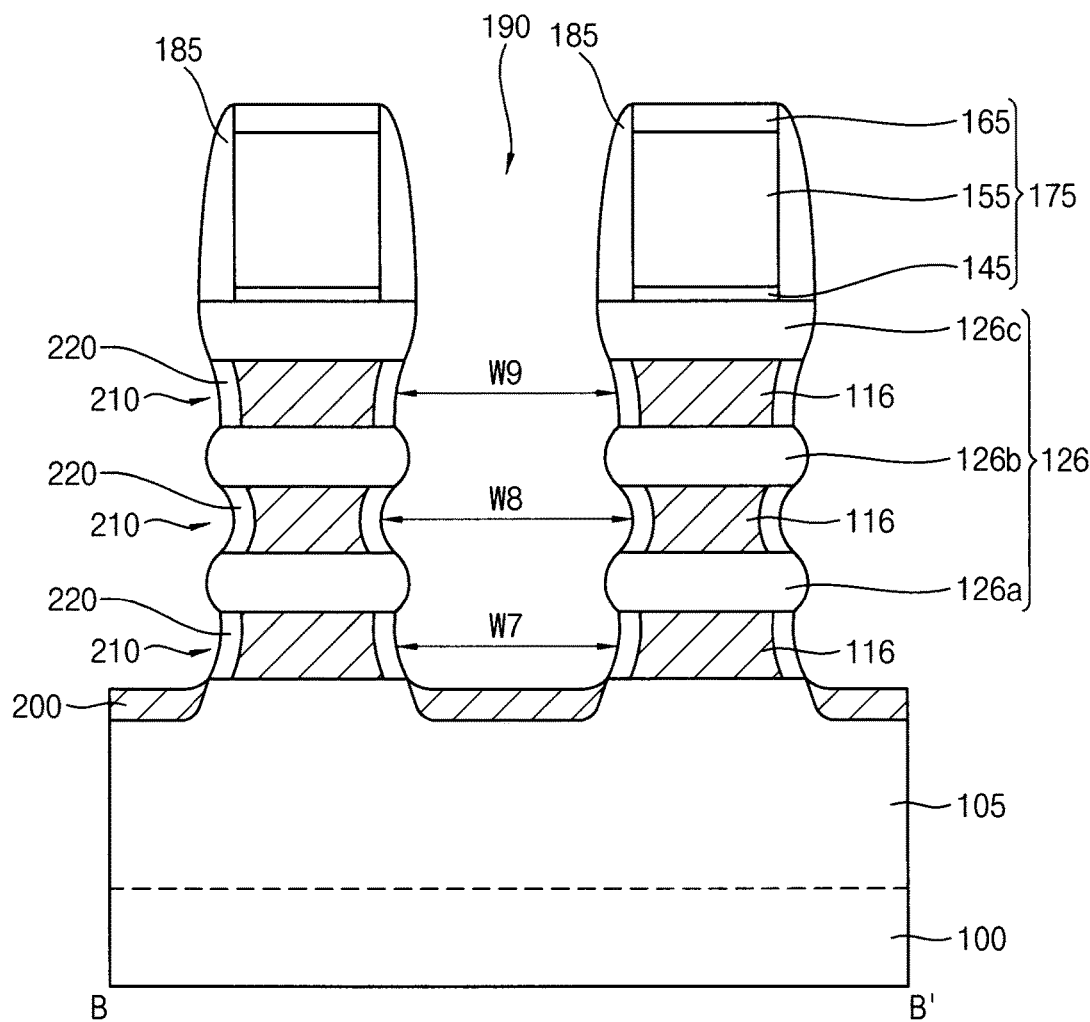
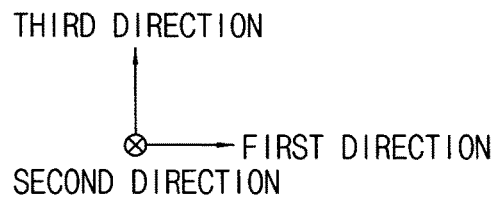

FIG. 16
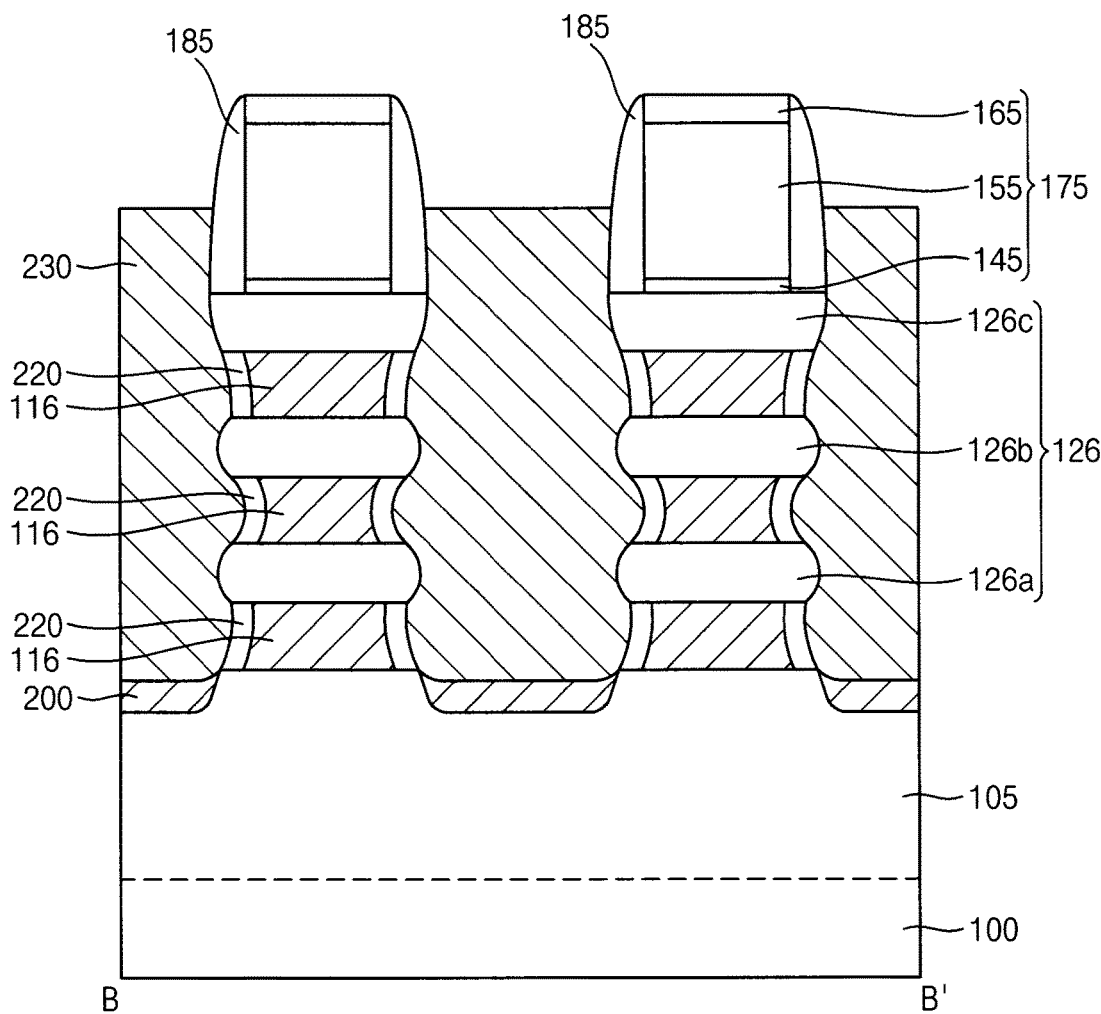
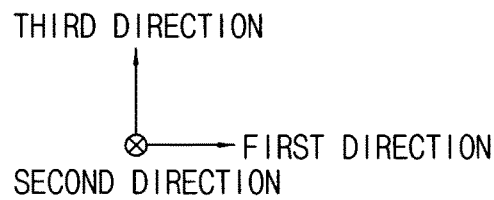

SEMICONDUCTOR DEVICES

CROSS-REFERENCE TO RELATED APPLICATION

This application claims priority under 35 USC § 119 to Korean Patent Application No. 10-2019-0063727, filed on May 30, 2019 in the Korean Intellectual Property Office (KIPO), the contents of which are herein incorporated by reference in their entirety.

BACKGROUND

1. Field

The inventive concepts relate to semiconductor devices. More particularly, the inventive concepts relate to semiconductor devices having a plurality of vertical channels.

2. Description of the Related Art

In a method of manufacturing a Multi Bridge Channel Field Effect Transistor (MBCFET) or the like, an opening may be formed to form a source/drain layer, and thus an upper portion of the substrate may be exposed. When the substrate is a silicon on insulator (SOI) substrate, since a portion of an insulation layer on the substrate may also be exposed, it is difficult to use the substrate as a seed for a selective epitaxial growth (SEG) process to be subsequently performed.

SUMMARY

Example embodiments provide a semiconductor device having improved electrical characteristics. According to example embodiments, there is provided a semiconductor device that includes a silicon on insulator (SOI) substrate, gate structures formed on the SOI substrate and being spaced apart from each other in a horizontal direction that is substantially parallel to an upper surface of the SOI substrate, a plurality of channels spaced apart from each other in a vertical direction substantially perpendicular to the upper surface of the SOI substrate, each of the channels extending through each of the gate structures in the horizontal direction, a seed layer on the SOI substrate, and a source/drain region on the seed layer, the source/drain region connected to the channels. Each sidewall of the source/drain region in the horizontal direction may have a concave-convex shape, and a protruding portion of the source/drain region formed between the gate structures may protrude in the horizontal direction compared to a non-protruding portion of the source/drain region formed between the channels.

According to example embodiments, there is provided a semiconductor device. The device may include a silicon on insulator (SOI) substrate, gate structures formed on the SOI substrate and being spaced apart from each other, a plurality of channels spaced apart from each other in a vertical direction substantially perpendicular to an upper surface of the SOI substrate, each of the channels extending through each of the gate structures in a horizontal direction substantially parallel to the upper surface of the SOI substrate, a seed layer having a lower surface that is downwardly convex and including silicon-germanium, and a source/drain region on the seed layer, the source/drain region being connected to the channels.

According to example embodiments, there is provided a semiconductor device. The device may include a silicon on insulator (SOI) substrate, gate structures formed on the SOI substrate and being spaced apart from each other in a horizontal direction substantially parallel to an upper surface of the SOI substrate, a plurality of channels spaced apart from each other in a vertical direction substantially perpendicular to the upper surface of the SOI substrate, each of the channels extending through each of the gate structures, a seed layer on the SOI substrate, the seed layer including silicon-germanium, and a source/drain region on the seed layer, the source/drain region being connected to the channels and having a variable width in the horizontal direction that varies along the vertical direction.

A semiconductor device in accordance with example embodiments may include a seed layer under an opening that is formed on a SOI substrate, the seed layer may be used as a seed for a SEG process, and thus a source/drain layer may be effectively formed.

BRIEF DESCRIPTION OF THE DRAWINGS

FIGS. 1 to 3 are a plan view and cross-sectional views illustrating a semiconductor device in accordance with example embodiments.

FIGS. 4 to 17 are plan views and cross-sectional views illustrating stages of a method of manufacturing a semiconductor device in accordance with example embodiments.

DESCRIPTION OF EMBODIMENTS

Semiconductor devices and methods of manufacturing the same in accordance with example embodiments will be described more fully hereinafter with reference to the accompanying drawings.

Figure 1:
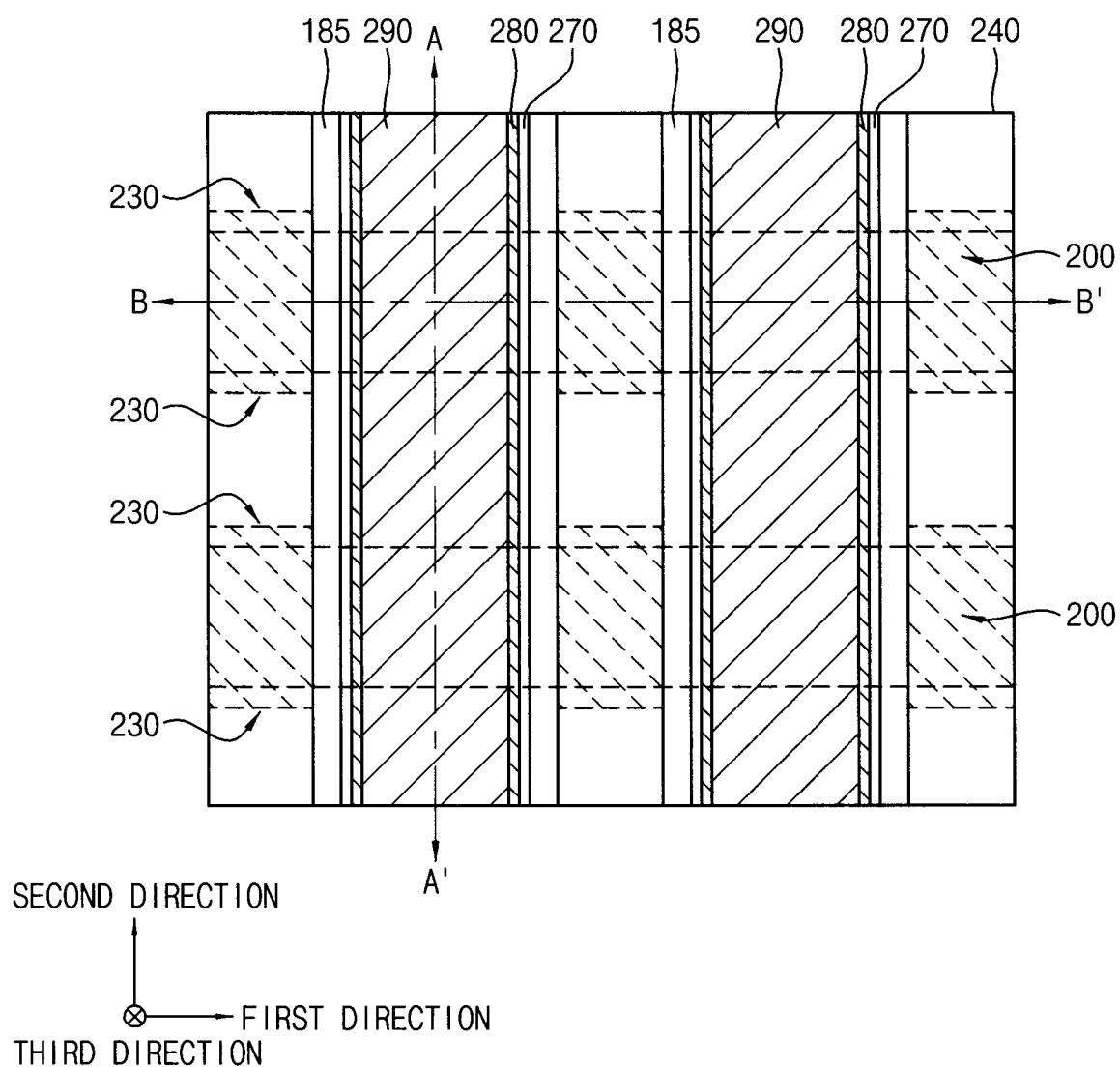
Figure 3:
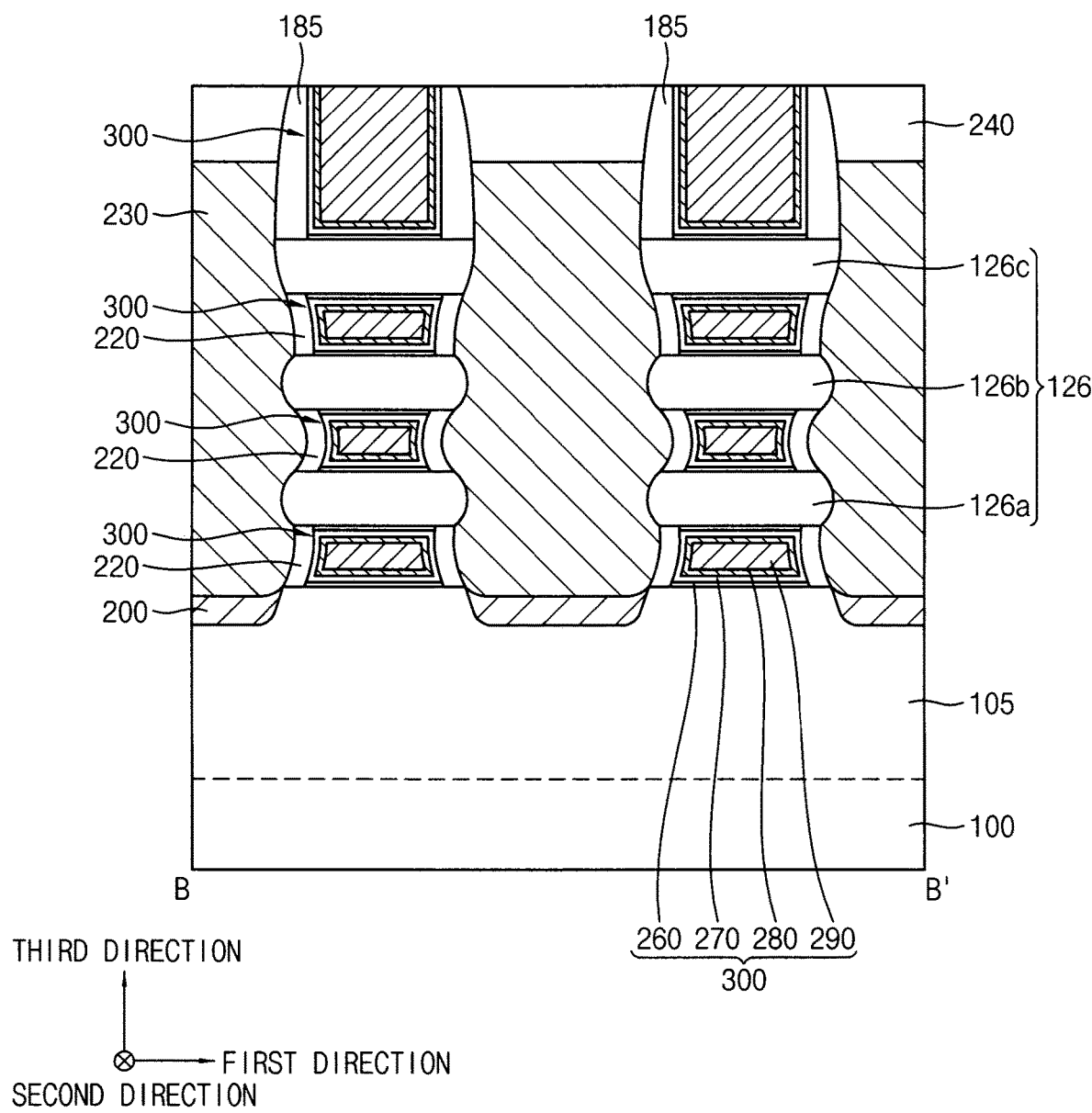

FIGS. 1 to 3 are a plan view and cross-sectional views illustrating a semiconductor device in accordance with example embodiments. FIG. 1 is the plan view, and FIGS. 2 and 3 are the cross-sectional views. FIG. 2 is a cross-sectional view taken along a line A-A' of FIG. 1, and FIG. 3 is a cross-sectional view taken along a line B-B' of FIG. 1.

Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In example embodiments, the first and second directions may be orthogonal to each other.

Directions described as parallel or perpendicular shall be understood as encompassing acceptable variations that may occur, for example, due to manufacturing processes, tools of measurement, and/or surfaces that are not 100% consistently level throughout. The term "substantially" used with "parallel" or "perpendicular" may encompass an exactly parallel or perpendicular orientation or an orientation with these acceptable variations. The term "substantial" shall have a meaning understood by context unless clearly intended to have an alternate meaning.

Referring to FIGS. 1 to 3, the semiconductor device may include a semiconductor pattern structure 126, a gate structure 300, a seed layer 200, a source/drain region 230, and first and second spacers 185 and 220 disposed on or above a substrate 100, e.g., a silicon on insulator substrate. Also, the semiconductor device may further include an active region 105, an isolation pattern 130, and an insulation layer 240.

The active region 105 may protrude from the substrate 100 in the third direction, and may extend in the first direction. FIG. 2 describes only two active regions 105 spaced apart from each other in the second direction, however, the inventive concept is not limited thereto, and three or more active regions 105 may be formed to be spaced apart from each other on the substrate 100 in the second direction. The active region 105 may be formed by partially removing an upper portion of the substrate 100. Additionally, the active region 105 may be integrally formed with the substrate 100 to include substantially the same material as the substrate 100.

The sidewall surfaces of the active region 105 may be covered by the isolation pattern 130. The isolation pattern 130 may include an oxide, e.g., silicon oxide.

The semiconductor pattern structure may include first to third semiconductor patterns 126a, 126b, and 126c, and the first to third semiconductor patterns 126a, 126b, and 126c may be formed at a plurality of levels so as to be spaced apart from each other in the third direction from an upper surface of the active region 105. Each of the first to third semiconductor patterns 126a, 126b, and 126c may serve as a channel of the semiconductor device, and thus may also be referred to as first to third channels. FIGS. 2 and 3 describe that the first to third semiconductor patterns 126a, 126b, and 126c are formed at three levels, however, the inventive concept is not limited thereto.

Also, FIG. 3 describes that two semiconductor pattern structures 126 are formed to be spaced apart from each other in the first direction on the active region 105 extending in the first direction, however, the inventive concept is not limited thereto, and three or more semiconductor pattern structures 126 may also be formed to be spaced apart from each other in the first direction.

In example embodiments, the substrate 100 may be a silicon-on-insulator (SOI) substrate, or a germanium-on-insulator (GOI) substrate, and each of the first to third semiconductor patterns may be a nano-sheet or a nano-wire including a semiconductor material, e.g., silicon, germanium, etc.

The source/drain region 230 may contact sidewalls of the first and second spacers 185 and 220 covering a sidewall of the gate structure 300, and a sidewall of the semiconductor pattern structure 126.

In example embodiments, a sidewall of the source/drain region 230 in the first direction may have a concave-convex shape. In example embodiments, a portion (protruding portion) of the sidewall of the source/drain region 230 formed between the gate structures 300 neighboring each other in the first direction may protrude in the first direction compared to a portion (non-protruding portion) of the sidewall of the source/drain region 230 formed between semiconductor pattern structures 126 neighboring each other in the first direction at the same level. For example, the protruding portion may correspond to a, portion of source/drain region 230 formed between horizontally adjacent sections of a first gate electrode structure 300 and a second gate electrode structure 300 and the non-protruding portion may correspond to a portion of source/drain region 230 formed between horizontally adjacent channels (e.g., a left channel 126a and a right channel 126a). In one embodiment, the source/drain region 230 may have the greatest width in the first direction at a portion (widest portion) formed at a height between the first nd second semiconductor patterns 126a and 126b.

In example embodiments, the source/drain region 230 may include silicon-germanium doped with p-type impurities, and thus may serve as a source/drain layer of a type P-type metal-oxide-semiconductor (PMOS) transistor.

The gate structure 300 may be formed on the substrate 100 to surround central portions of each of the first to third semiconductor patterns 126a, 126b, and 126c in the first direction. FIG. 2 describes that the gate structure 300 covers only the semiconductor pattern structures 126 each formed on two active regions 105 spaced apart from each other in the second direction, however, the inventive concept is not limited thereto. That is, the gate structure 300 may extend in the second direction on the substrate 100 on which the isolation pattern 130 is formed, and may cover a plurality of semiconductor pattern structures 126 each formed on three or more active regions 105 spaced apart from each other in the second direction, or may also cover only one semiconductor pattern structure 126 formed on one active region 105.

Also, FIG. 3 describes that two gate structures 300 are formed to be spaced apart from each other in the first direction on the substrate 100, however, the inventive concept is not limited thereto, and three or more gate structures 300 may also be formed to be spaced apart from each other in the first direction.

The gate structure 300 may include an interface pattern 260, a gate insulation pattern 270, a work function control pattern 280, and a gate electrode 290 sequentially stacked from a surface of each of the semiconductor pattern structures 126 or the upper surface of the active region 105.

The interface pattern 260 may be formed on the upper surface of the active region 105 and the surface of the semiconductor pattern structure 126, and the gate insulation pattern 270 may be formed on a surface of the interface pattern 260 and inner sidewalls of the first and second spacers 185 and 220. The work function control pattern 280 may be formed on the gate insulation pattern 270, and the gate electrode 290 may fill spaces between the semiconductor pattern structures 126 spaced apart from each other in the third direction and a space defined by the second spacers 220 spaced apart from each other in the first direction.

The interface pattern 260 may include an oxide, e.g., silicon oxide, and the gate insulation pattern 270 may include a metal oxide having a high dielectric constant, e.g., hafnium oxide, tantalum oxide, zirconium oxide, etc.

The work function control pattern 280 may include, e.g., titanium nitride, titanium oxynitride, titanium oxycarbonitride, titanium silicon oxide, titanium silicon oxynitride, titanium aluminum oxynitride, tantalum nitride, tantalum oxynitride, tantalum aluminum nitride, tantalum aluminum oxynitride, tungsten nitride, tungsten carbonitride, aluminum oxide, etc. The gate electrode 290 may include a metal, e.g., titanium, aluminum, etc., an alloy thereof, or a nitride or a carbide thereof.

The gate structure 300 may form a transistor together with the source/drain region 230 serving as the source/drain layer and each of the first to third semiconductor patterns 126a, 126b, and 126c serving as the channels, and the transistor may be a PMOS transistor according to the conductivity type of the impurities doped with the source/drain region 230. The transistor may include a plurality of channels stacked in the third direction, and thus may be a MBCFET.

In example embodiments, an upper surface of a portion of the gate structure 300 formed between the active region 105 and the first semiconductor pattern 126*a* may have a smaller length in the first direction than a lower surface thereof, an upper surface of a portion of the gate structure 300 formed between the first semiconductor pattern 126*a* and the second semiconductor pattern 126*b* may have substantially the same length in the first direction as a lower surface thereof, and an upper surface of a portion of the gate structure 300 formed between the second semiconductor pattern 126*b* and the third semiconductor pattern 126*c* may have a greater length in the first direction than a lower surface thereof. In one embodiment, the length in the first direction of the gate structure 300 may be the smallest at a central portion in the third direction of the gate structure 300 between the first semiconductor pattern 126*a* and the second semiconductor pattern 126*b*.

The gate structure 300 may be electrically insulated from the source/drain region 230 by the first and second spacers 185 and 220.

The first spacer 185 may cover both sidewalls in the first direction of an upper portion of the gate structure 300.

The second spacer 220 may cover both sidewalls in the first direction of a lower portion of the gate structure 300. In example embodiments, the second spacer 220 may have a concave shape.

The first spacer 185 may have a nitride, e.g., silicon nitride, and the second spacer 220 may have a nitride, e.g., silicon nitride, silicon carbonitride, silicon boron nitride, silicon oxycarbonitride, etc.

The insulation layer 240 may surround a sidewall of the first spacer 185 to cover the source/drain region 230. The insulation layer 240 may include an oxide, e.g., silicon oxide.

The seed layer 200 may be formed on the active region 105 and may include, e.g., silicon-germanium. For example, the seed layer 200 may be formed on a portion of the active region 105 between the gate structures 300 spaced apart from each other in the first direction.

In example embodiments, an upper surface of the seed layer 200 may include an edge portion that is not flat with respect to the upper surface of the substrate 100 and a center portion that is flat on the upper surface of the substrate 100. Alternatively, the upper surface of the seed layer 200 may have a flat shape or a concave shape as a whole. As used herein, the term "flat" shall have its plain and ordinary meaning which shall be understood by context unless clearly indicated otherwise. For example, when stating that the seed layer 200 is "flat" an exemplary meaning may be smooth and even; or without marked lumps or indentations while also taking into account slight variations due to manufacturing tolerances.

In example embodiments, similar to the upper surface of the seed layer 200, a lower surface of the seed layer 200 may include an edge portion that is not flat with respect to the upper surface of the substrate 100 and a center portion that is flat on the upper surface of the substrate 100. Alternatively, a lower surface of the seed layer 200 may also have a downwardly convex shape.

The semiconductor device may further include contact plugs, wirings, etc., (not illustrated) which may be electrically connected to the source/drain region 230 and/or the gate structure 300.

As described above, the semiconductor device may include the seed layer 200 between the active region 105 and the source/drain region 230, the seed layer 200 may be used as a seed for a SEG process for forming the source/drain region 230, so that the source/drain region 230 may have improved characteristics. This will be described later.

Figure 6:
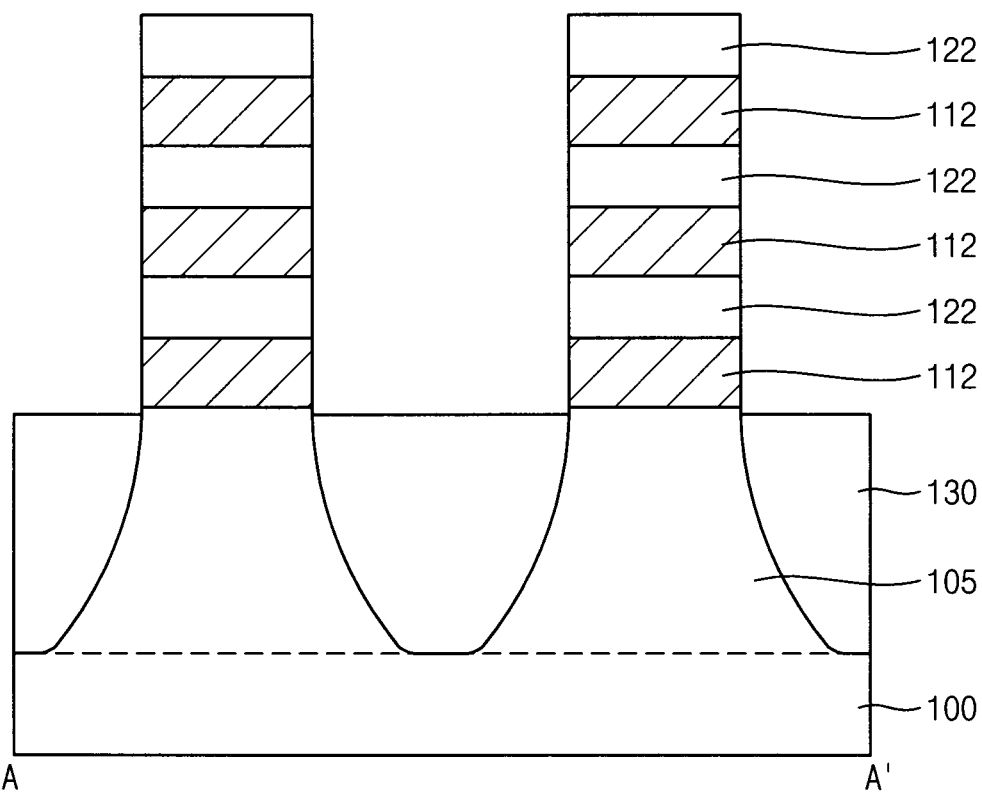

FIGS. 4 to 17 are plan views and cross-sectional views illustrating stages of a method of manufacturing a semiconductor device in accordance with example embodiments. Specifically, FIGS. 4, 7, 10, and 12 are the plan views, FIGS. 5, 6, 8, 9, 11, and 13-17 are the cross-sectional views. FIGS. 5, 6, and 8 are cross-sectional views taken along lines A-A' of corresponding plan views, respectively; FIGS. 9, 11, and 13-17 are cross-sectional views taken along lines B-B' of corresponding plan views, respectively.

Figure 4:
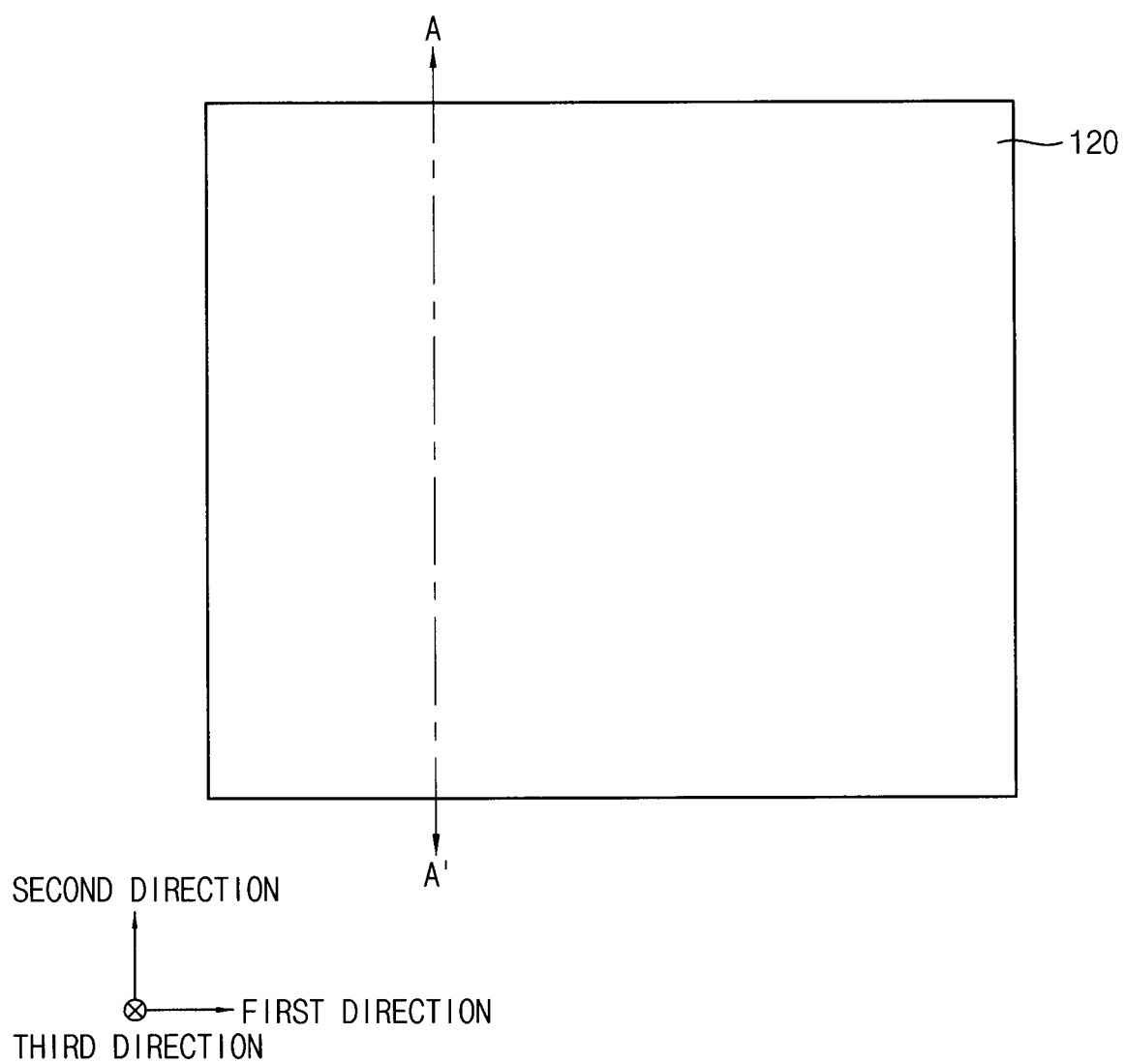

Referring to FIGS. 4 and 5, a sacrificial layer 110 and a semiconductor layer 120 may be alternately and repeatedly stacked on a substrate 100.

FIG. 5 describes that the sacrificial layers 110 and the semiconductor layers 120 are formed at each of three levels, however, the inventive concept is not limited thereto.

The substrate 100 may be a silicon-on-insulator (SOI) substrate, or a germanium-on-insulator (GOI) substrate. The term, "semiconductor on insulator" may be used herein to refer to both a silicon-on-insulator substrate, and a germanium-on-insulator substrate.

The semiconductor layer 120 may be a nano-sheet or a nano-wire including semiconductor material, e.g., silicon, germanium, etc., and the sacrificial layer 110 may include a material having an etching selectivity to the substrate 100 and the semiconductor layer 120, e.g., silicon-germanium.

Hereinafter, only the case that the substrate 100 is a SOI substrate, the semiconductor layer 120 is a nano-sheet or a nano-wire including silicon, and the sacrificial layer 110 includes silicon-germanium will be described, however, the inventive concept is not limited thereto. That is, the substrate 100 may be a GOI substrate, the semiconductor layer 120 may be a nano-sheet or a nano-wire including germanium, and the sacrificial layer 110 may include a silicon-germanium.

Referring to FIG. 6, a hard mask (not shown) may be formed to extend in the first direction on an uppermost semiconductor layer 120, and the semiconductor layers 120, the sacrificial layers 110, and an upper portion of the substrate 100 may be etched using the hard mask as an etching mask.

Accordingly, an active region 105 may be formed to extend in the first direction on the substrate 100, and a fin structure including sacrificial lines 112 and semiconductor lines 122 alternately and repeatedly stacked on the active region 105 may be formed. In example embodiments, a plurality of fin structures may be formed to be spaced apart from each other in the second direction on the substrate 100.

After removing the hard mask, an isolation pattern 130 may be formed to cover a sidewall of the active region 105 on the substrate 100.

Figure 7:
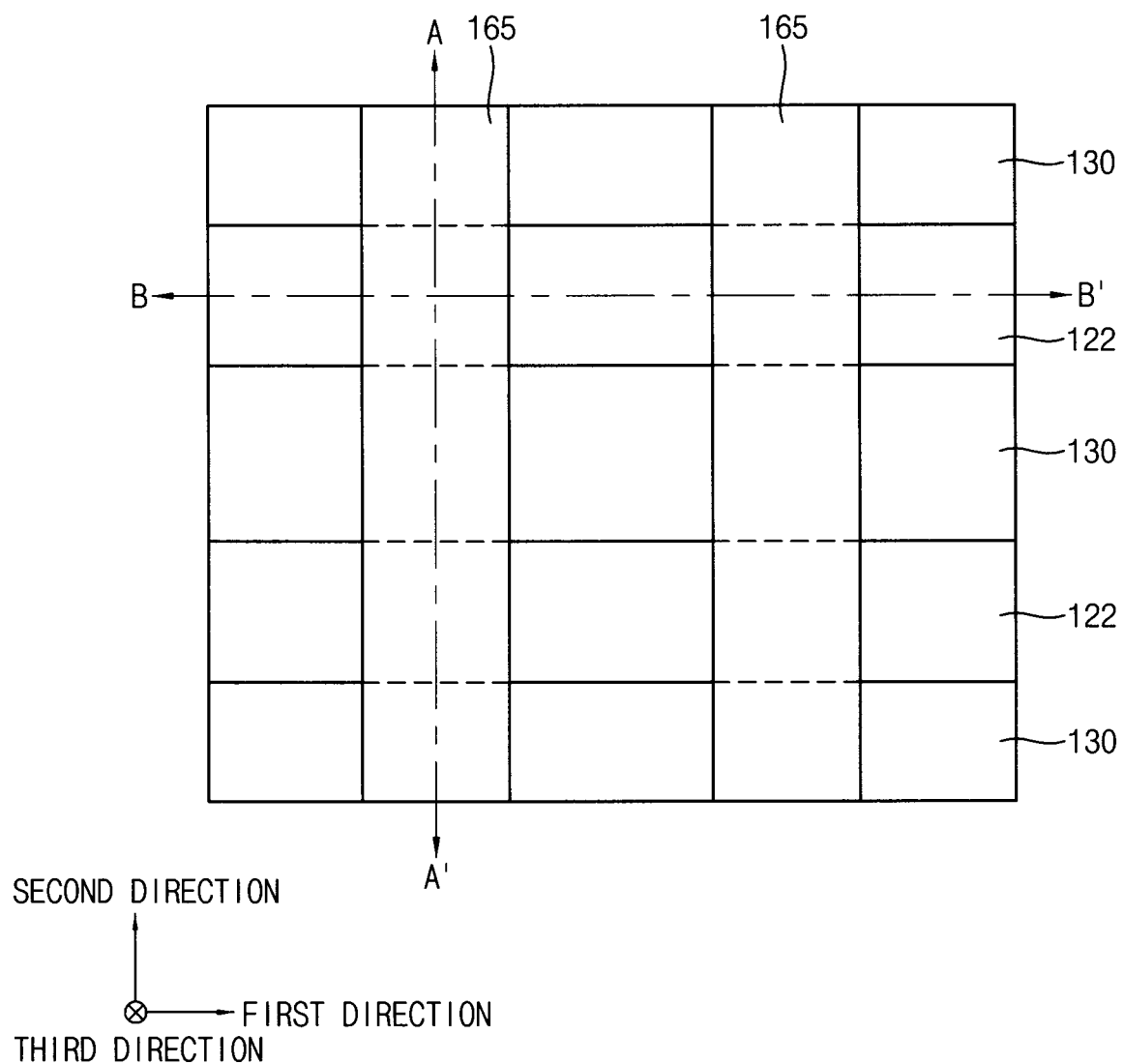
Figure 8:
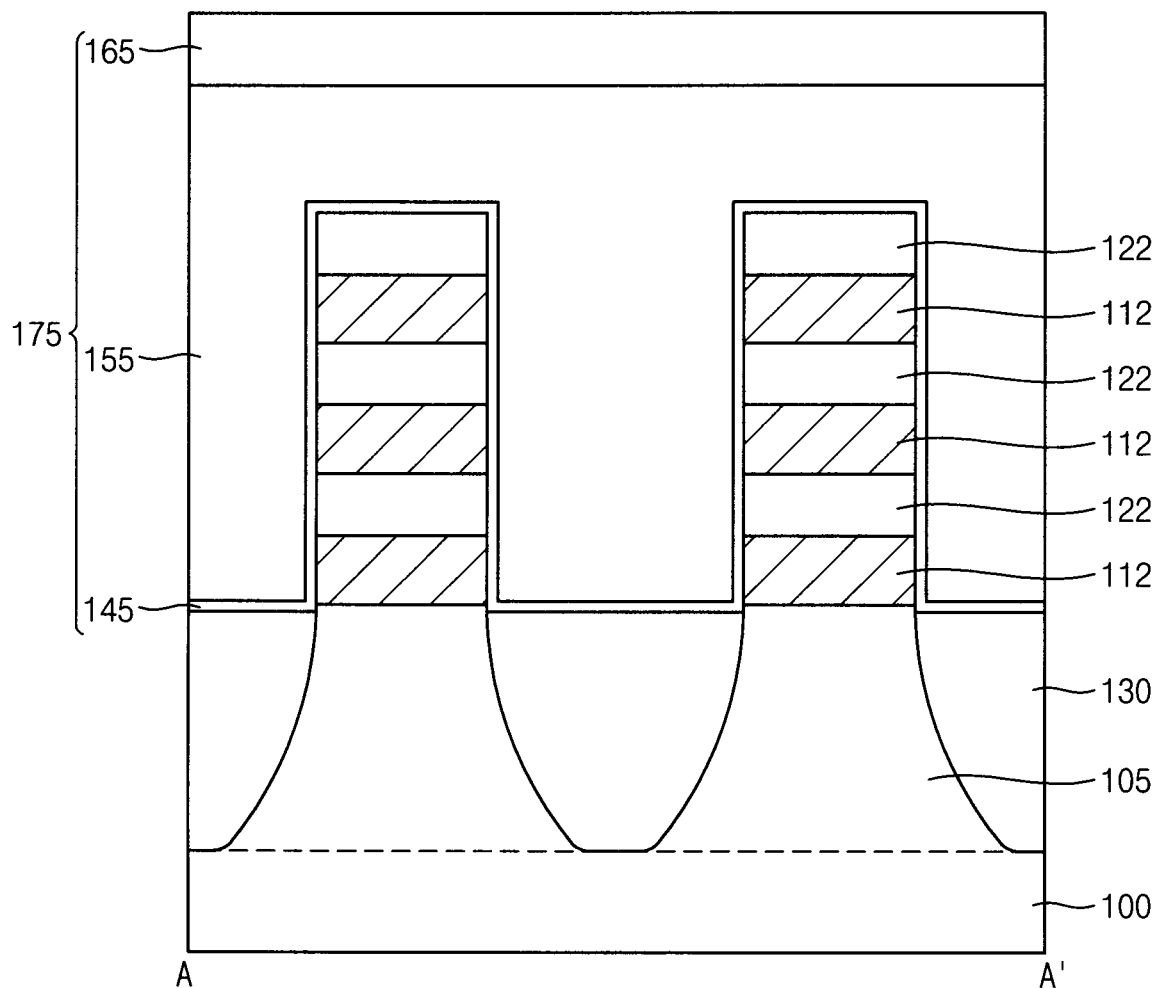
Figure 9:
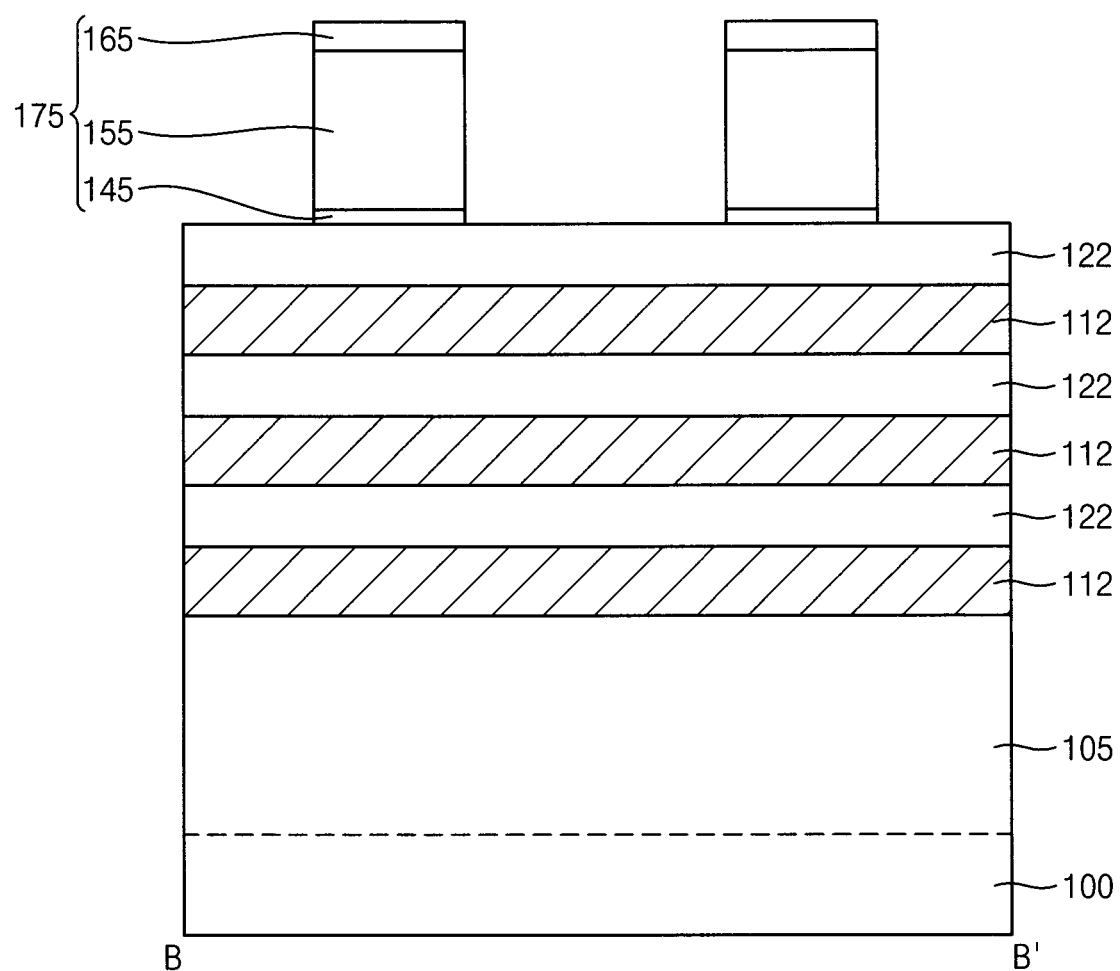

Referring to FIGS. 7 to 9, a dummy gate structure 175 may be formed to partially cover the fin structure and the isolation pattern 130 on the substrate 100.

For example, a dummy gate insulation layer, a dummy gate electrode layer, and a dummy gate mask layer may be sequentially formed on the substrate 100 on which the fin structure and the isolation pattern 130 may be formed, a photoresist pattern (not shown) may be formed on the dummy gate mask layer to extend in the second direction, and the dummy gate mask layer may be etched using the photoresist pattern as an etching mask to form a dummy gate mask 165 on the substrate 100.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the dummy gate mask 165 as an etching mask to form a dummy gate electrode 155 and a dummy gate insulation pattern 145, respectively, on the substrate 100.

The dummy gate insulation pattern 145, the dummy gate electrode 155, and the dummy gate mask 165 sequentially stacked on the active region 105 and a portion of the isolation pattern 130 adjacent thereto may form a dummy gate structure 175. In example embodiments, the dummy gate structure 175 may extend in the second direction on the fin structure and the isolation pattern 130, and may cover an upper surface and both sidewalls in the second direction of the fin structure.

Figure 10:
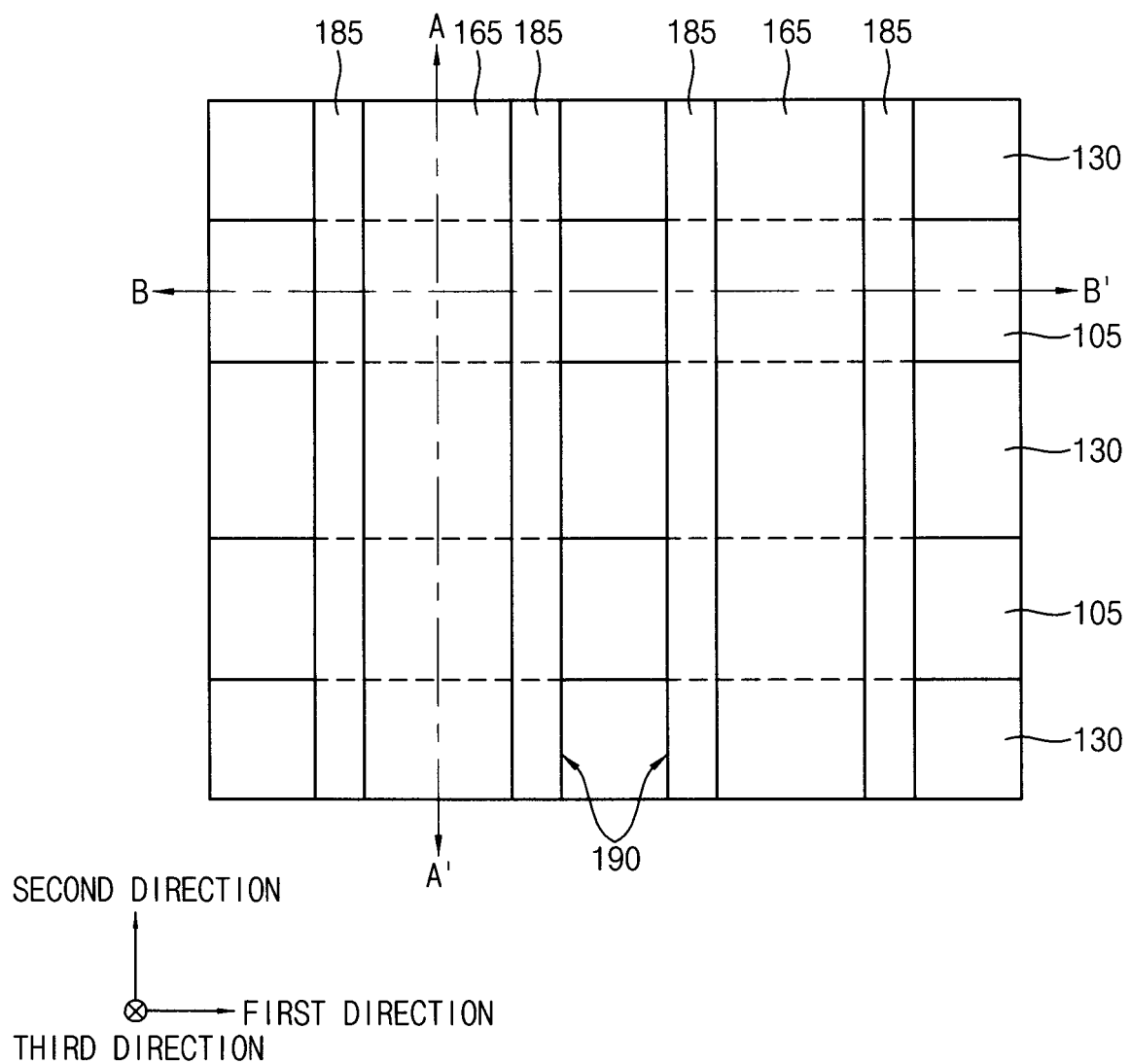
Figure 11:
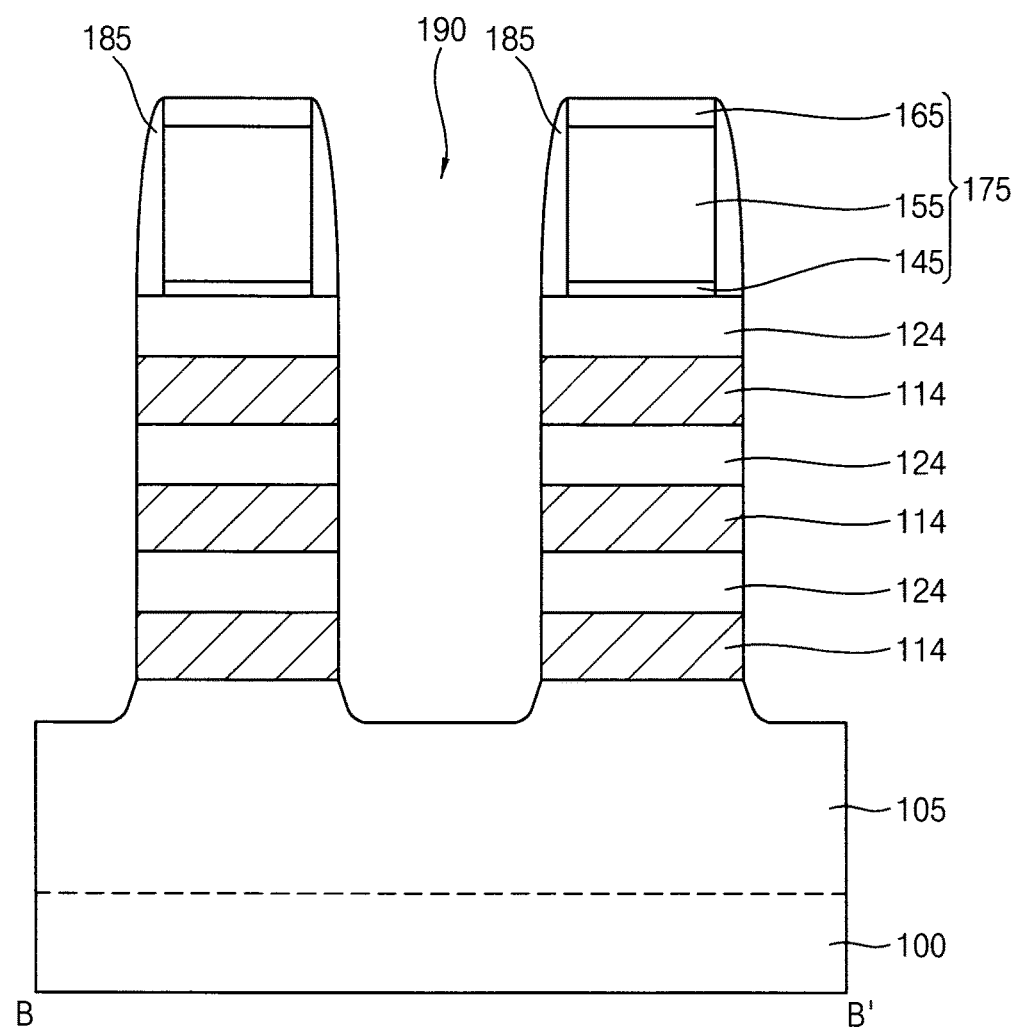

Referring to FIGS. 10 and 11, a first spacer 185 may be formed on a sidewall of the dummy gate structure 175, and the fin structure may be etched using the dummy gate structure 175 and the first spacer 185 as an etching mask to expose the upper surface of the active region 105 on the substrate 100.

For example, after forming a first spacer layer on the substrate 100 on which the tin structure, the isolation pattern 130, and the dummy gate structure 175 may be formed, the first spacer layer may be anisotropically etched to form the first spacer 185 covering both sidewalls in the first direction of each of the dummy gate structure 175.

The sacrificial lines 112 and the semiconductor lines 122 under the dummy gate structure 175 and the first spacer 185 may be converted into preliminary sacrificial patterns 114 and preliminary semiconductor patterns 124, respectively, and the fin structure extending in the second direction may be separated into a plurality of parts to be spaced apart from each other along the first direction.

Each of the dummy gate structures 175, the first spacer 185 on both sidewalls of each of the dummy gate structures 175, and the fin structure under the dummy gate structure 175 and the first spacer 185 may extend in the second direction, and may be formed in a plural number to be spaced apart from each other along the first direction. A first opening 190 may be formed to expose the active region 105 and the isolation pattern 130 between adjacent dummy gate structures 175, the first spacers 185 on both sidewalls of each dummy gate structure 175, and the fin structures thereunder.

In example embodiments, the upper surface of the active region 105 exposed by the first opening 190 may be lower than a lower surface of the fin structure.

Figure 12:
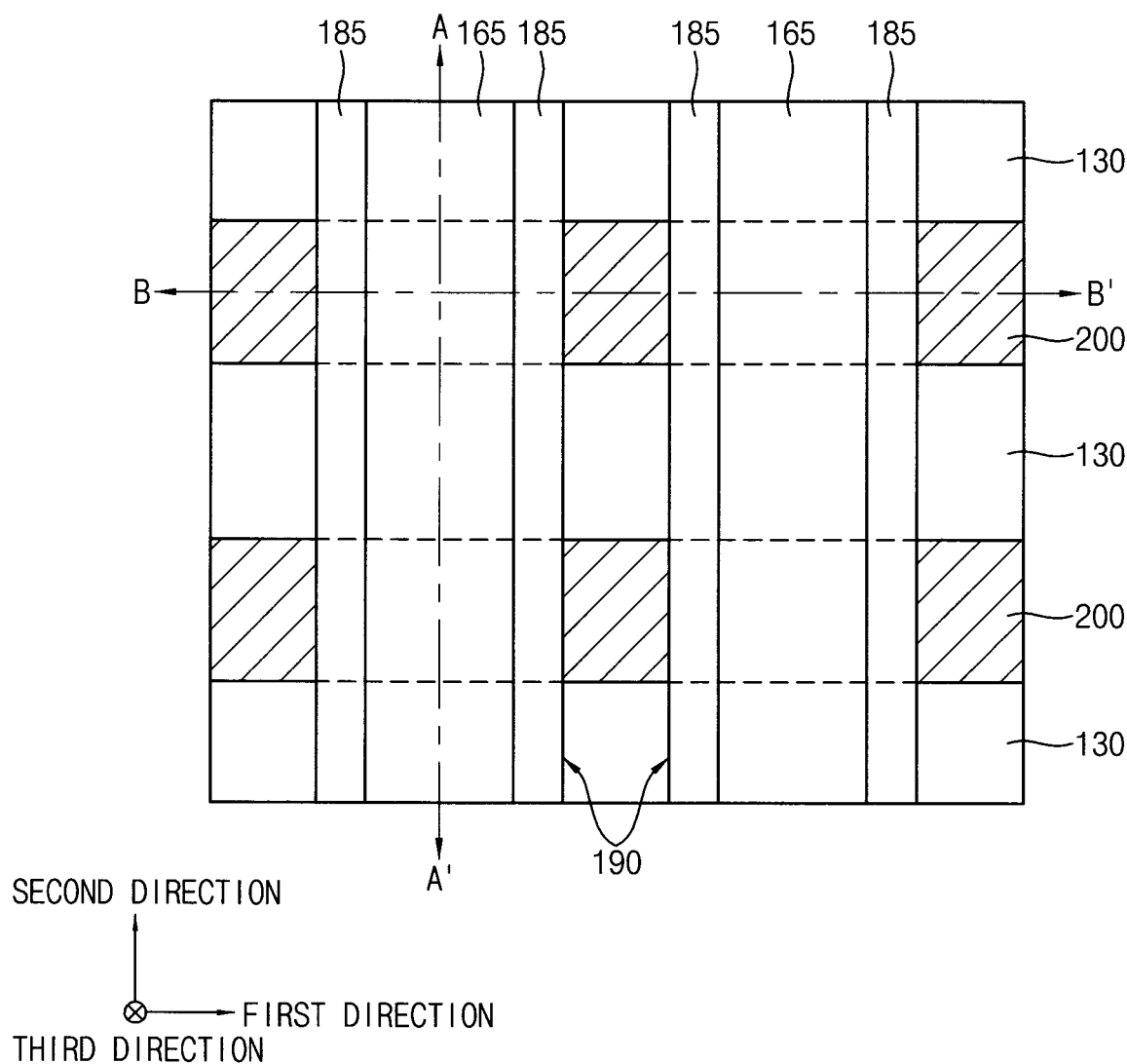
Figure 13:
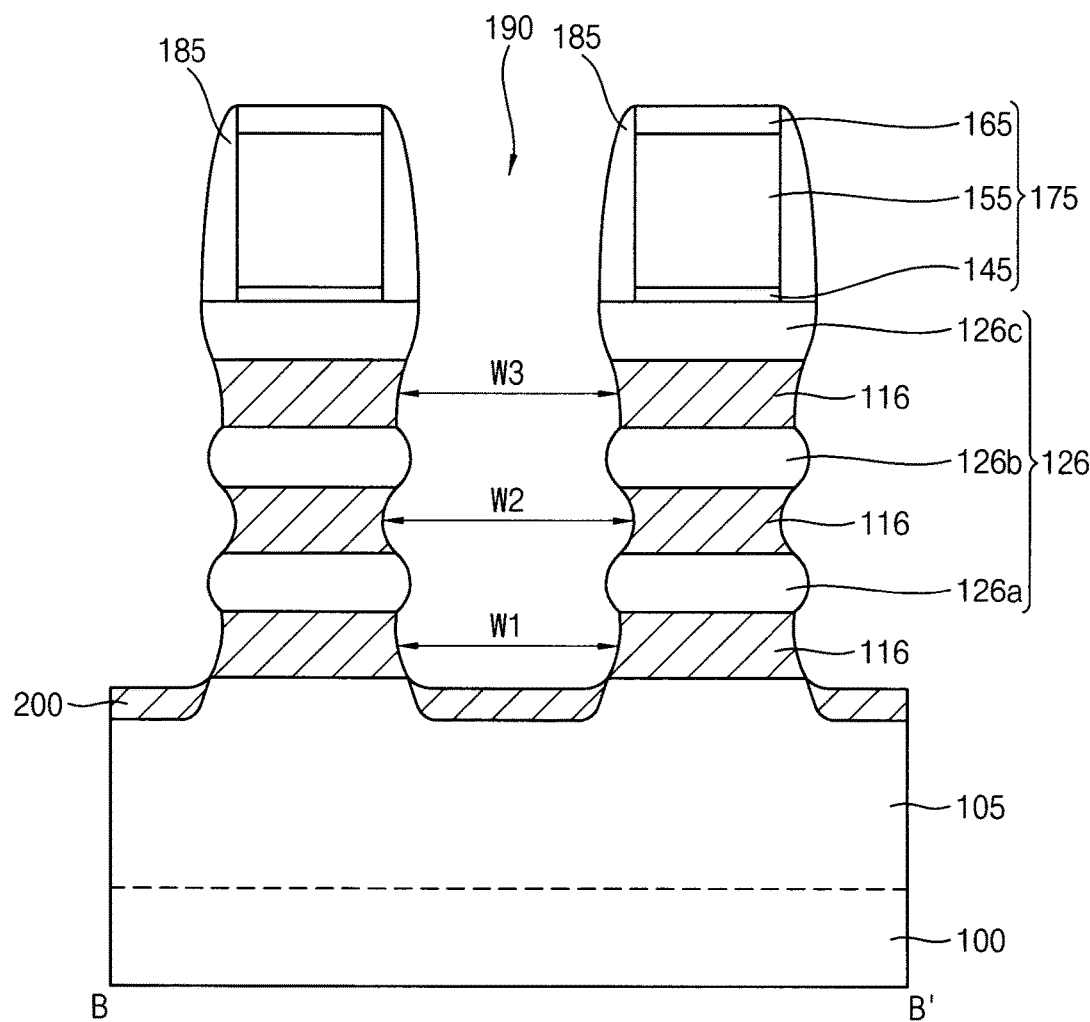

Referring to FIGS. 12 and 13, a cleaning process and a baking process may be performed on the fin structures exposed by the first opening 190.

Accordingly, sidewalk of each of the preliminary sacrificial patterns 114 and the preliminary semiconductor patterns 124 exposed by the first opening 190 may be partially melted by heat to migrate downwardly, each migrated portion of the sidewall of the preliminary sacrificial pattern 114 and migrated portion of the sidewall of the preliminary semiconductor pattern 124 may be merged on the exposed upper surface of the active region 105 to form a seed layer 200, and the seed layer 200 may partially fill a lower portion of the first opening 190.

By the cleaning process and the baking process, the preliminary sacrificial patterns 114 may be converted into sacrificial patterns 116, and the preliminary semiconductor patterns 124 may form a semiconductor pattern structure 126, and the semiconductor pattern structure 126 may include first to third semiconductor patterns 126a, 126b, and 126c sequentially stacked.

In one example embodiment, an upper surface of the seed layer 200 may be lower than a lower surface of the sacrificial pattern 116 formed between the active region 105 and the semiconductor pattern structure 126.

Since the seed layer 200 is formed by melting the preliminary sacrificial pattern 114 to migrate downwardly, the seed layer 200 may include substantially the same material as the sacrificial pattern 116, e.g., silicon-germanium. However, since the seed layer 200 is formed by melting not only the preliminary sacrificial pattern 11A, but also the preliminary semiconductor pattern 124 to migrate downwardly, the seed layer 200 may further include substantially the same material as the semiconductor pattern structure 126, e.g., silicon. Accordingly, the seed layer 200 may include silicon-germanium having a lower germanium concentration than the preliminary sacrificial pattern 114.

The seed layer 200 may be used as a seed for a selective epitaxial growth (SEG) process to be subsequently performed.

In example embodiments, an upper surface of the seed layer 200 may include an edge portion that is not flat with respect to the upper surface of the substrate 100 and a center portion that is flat on the upper surface of the substrate 100. Alternatively, the upper surface of the seed layer 200 may also have a flat shape or a concave shape as a whole.

A portion of the sacrificial pattern 116 between the active region 105 and the first semiconductor pattern 126a, and the upper surface of the seed layer 200 may be connected to each other, however, the inventive concept is not limited thereto, and they may not be connected to each other.

In example embodiments, similar to the upper surface of the seed layer 200, a lower surface of the seed layer 200 may include an edge portion that is not flat with respect to the upper surface of the substrate 100 and a center portion that is flat on the upper surface of the substrate 100. Alternatively, a lower surface of the seed layer 200 may also have a downwardly convex shape.

The preliminary sacrificial patterns 114 and the preliminary semiconductor patterns 124 may migrate downwardly by melting different amounts by the cleaning process and the baking process.

That is, the preliminary semiconductor pattern 124 may be a nano-sheet or a nano-wire including silicon, the preliminary sacrificial pattern 114 may include silicon-germanium, and each silicon and silicon-germanium may have different melting points. Thus, each of the preliminary sacrificial patterns 114 and the preliminary semiconductor patterns 124 may be melted by different amounts by the cleaning process and the baking process.

In example embodiments, as the cleaning process and the baking process are performed, the first opening 190 may partially extend in the first direction, and sidewalls of the first opening 190 opposite to each of the sacrificial patterns 116 may have a concave-convex shape as a whole. A portion of the sidewall of the first opening 190 formed between neighboring semiconductor pattern structures 126 adjacent to each other in the first direction may protrude compared to a portion of the sidewall of the first opening 190 formed between neighboring sacrificial patterns 116 adjacent to each other in the first direction.

As the cleaning process and the baking process are performed, a central portion in the third direction of the first opening 190 may be more extended in the first direction than a lower portion or an upper portion thereof. Thus, the first opening 190 may have first to third widths W1, W2, and W3 in the first direction according to the heights thereof.

The first width W1 may be a width in the first direction between neighboring sacrificial patterns 116 between the active region 105 and the first semiconductor pattern 126a, the second width W2 may be a width in the first direction between neighboring sacrificial patterns 116 between the first semiconductor pattern 126a and the second semiconductor pattern 126b, and the third width W3 may be a width in the first direction between neighboring sacrificial patterns 116 between the second semiconductor pattern 126b and the third semiconductor pattern 126c.

In example embodiments, the second width W2 may be greater than the first width W1 and/or the third width W3, however, the first and third widths W1 and W3 may be substantially the same as one another. Alternatively, the second width W2 may be greater than the first width W1 and/or the third width W3, and however, the first and third widths W1 and W3 may be different to each other. In this case, the first width W1 may be greater than the third width W3, but the third width W3 may also be greater than the first width W1.

After the cleaning process and the baking process, lengths in the first direction of each of the first to third semiconductor patterns 126a, 126b, and 126c of the semiconductor pattern structure 126 may vary along the third direction.

In example embodiments, an upper surface of the first semiconductor pattern 126a may have a length in the first direction smaller than a lower surface thereof, an upper surface of the second semiconductor pattern 126b may have the same length in the first direction as a lower surface thereof, and an upper surface of the third semiconductor pattern 126c may have a length in the first direction greater than a lower surface thereof.

The cleaning process may include an aching process and/or a stripping process, and the baking process may include a heat treatment process, and the cleaning process and the baking process may be performed in-situ.

Figure 14:
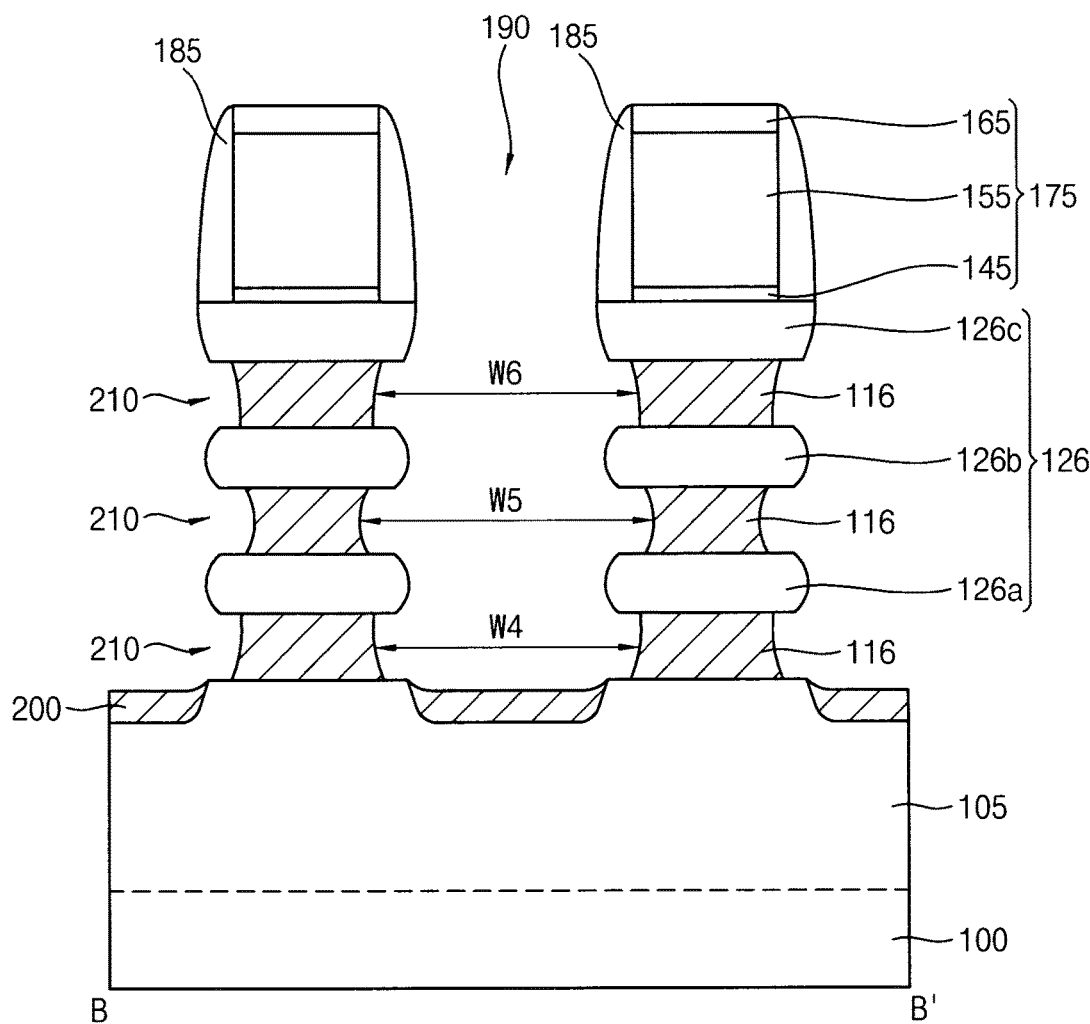

Referring to FIG. 14, both sidewalls in the first direction of the sacrificial patterns 116 exposed by the first opening 190 may be etched to form first recesses 210, and thus the first to third widths W1, W2, and W3 of the first opening 190 may extend to fourth to sixth widths W4, W5, and W6.

In example embodiments, the fifth width W5 may be greater than the fourth width W4 and/or the sixth width W6 however, the fourth and sixth widths may be the same as each other.

The first recesses 210 may be formed by performing a wet etching process on the sacrificial patterns 116. Accordingly, each of the first recesses 210 may have a concave shape.

That is, sacrificial pattern 116 formed between the active region 105 and the first semiconductor pattern 126a among the sacrificial patterns 116 on which the first recesses 210 are formed may have a width in the first direction gradually decreasing from top to bottom, sacrificial pattern 116 formed between the first semiconductor pattern 126a and the second semiconductor pattern 126b among the sacrificial patterns 116 may have a width iii the first direction that increases from top to center and then decreases from center to bottom, and sacrificial pattern 116 formed between the second semiconductor pattern 126b and the third semiconductor pattern 126c among the sacrificial patterns 116 may have a width in the first direction gradually increasing from top to bottom.

In one embodiment, as the seed layer 200 includes silicon-germanium, the upper surface of the seed layer 200 may be partially removed when the wet etching process is performed.

Referring to FIG. 15, a second spacer 220 may be formed to fill each of the first recesses 210.

The second spacer 220 may be formed by forming a second spacer layer to fill the first recesses 210 on the dummy gate structure 175, the first spacer 185, the fin structure, the active region 105 of the substrate 100, and the isolation pattern 130, and anisotropically etching the second spacer layer. The second spacer layer may be formed by a deposition process, e.g., a chemical vapor deposition (CVD) process, an atomic layer deposition (ALD) process, etc.

In example embodiments, similar to the shape of each of the first recesses 210, the second spacer 220 may also have a concave shape as a whole.

In example embodiments, as the second spacer 220 is formed, the fourth to sixth widths W4, W5, and W6 of the first opening 190 may be reduced to seventh to ninth widths W7, W8, and W9, respectively. The eighth width W8 may be greater than the seventh width W7 and/or the ninth width W9, however, the seventh and ninth widths W7 and W9 may be substantially the same as each other.

Referring to FIG. 16, a source/drain region 230 may be formed on the upper surface of the seed layer 200 exposed by the first opening 190.

The source/drain region 230 may be formed by performing a SEG process using the upper surface of the seed layer 200 exposed by the first opening 190 as a seed.

The source/drain region 230 may contact sidewalls of the semiconductor pattern structures 126, and outer sidewalls of the second spacer 220 covering sidewalls of the sacrificial patterns 116. The source/drain region 230 may further grow in the third direction to contact sidewalls of the first spacer 185.

In example embodiments, a sidewall in the first direction of the source/drain region 230, that is, a sidewall opposite to each of the sacrificial patterns 116 may have a concave-convex shape (e.g., a vertical sidewall that has a concave-convex shape with respect to the horizontal direction that is undulating). A portion (protruding portion) of the sidewall of the source/drain region 230 that is formed between the gate structures 300 neighboring each other in the first direction being horizontally adjacent) may protrude in the first direction compared to a portion (non-protruding portion) of the sidewall of the source/drain region 230 formed between corresponding semiconductor patterns 126a, 126b, and/or 126c of semiconductor pattern structures 126 neighboring each other in the first direction (e.g., a first semiconductor pattern 126a and a different semiconductor pattern 126a that are horizontally adjacent to one another on opposite sides of recess 210 and thus may be considered "corresponding"), In one embodiment, the source/drain region 230 may have the greatest width in the first direction at a portion (wide portion) formed at a height between the first and second semiconductor patterns 126a and 126b.

The SEG process may be performed using, e.g., a silicon source gas such as dichlorosilane ($SiH_2Cl_2$) gas, a germanium source gas such as germanium tetrahydride ($GeH_4$) gas, and a p-type impurity source gas together, and thus a single crystal silicon-germanium (SiGe) layer doped with p-type impurities may be formed. The source/drain region 230 may serve as a source/drain layer of a PMOS transistor.

Figure 17:
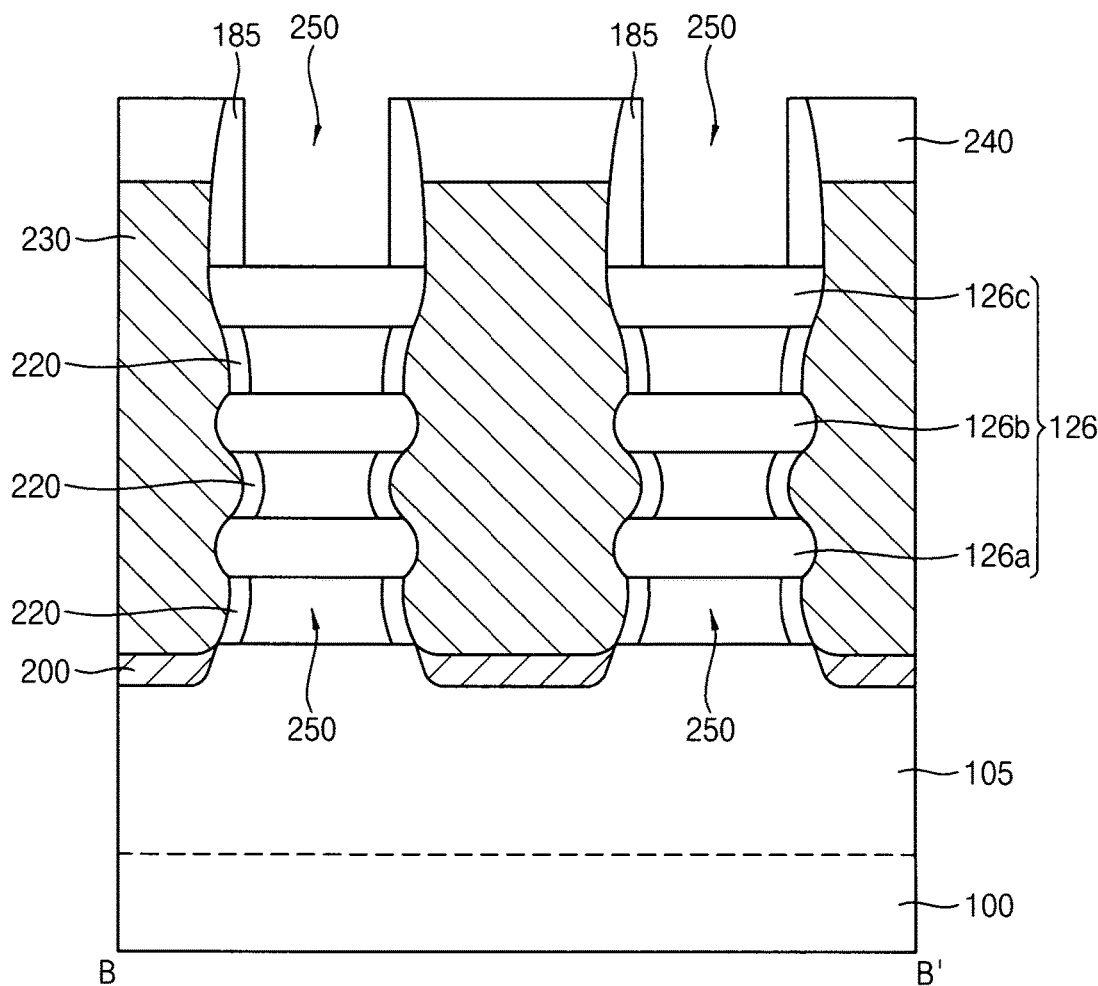

Referring to FIG. 17, after forming an insulation layer 240 to cover the dummy gate structure 175, the first spacer 185, and the source/drain region 230 on the substrate 100, the insulation layer 240 may be planarized until an upper surface of the dummy gate electrode 155 may be exposed. The dummy gate mask 165 may also be removed, and an upper portion of the first spacer 185 may also be partially removed.

The planarization process may be performed by a chemical mechanical polishing (CMP) process and/or an etch back process.

The exposed dummy gate electrode 155, the dummy gate insulation pattern 145 thereunder, and the sacrificial patterns 116 may be removed by, e.g., a wet etching process and/or a dry etching process, and a second opening 250 may be formed to expose an inner sidewall of the first spacer 185, an inner sidewall of the second spacer 220, a surface of the semiconductor pattern structure 126, and the upper surface of the active region 105.

Referring to FIGS. 1 to 3 again, a gate structure 300 may be formed to fill the second opening 250 on the substrate 100.

For example, after performing a thermal oxidation process on the upper surface of the active region 105 and the surface of the semiconductor pattern structure 126 exposed by the second opening 250 to form an interface pattern 260, a gate insulation layer and a work function control layer may be conformally formed on a surface of the interface pattern 260, the car sidewalls of the first and second spacers 185 and 220, and an upper surface of the insulation layer 240, and a gate electrode layer may be formed to sufficiently fill a remaining portion of the second opening 250.

The gate insulation layer, the work function control layer, and the gate electrode layer may be formed by, e.g., a chemical vapor deposition (CVD) process, an atomic layer deposition (ALD) process, a physical vapor deposition (PVD) process, etc. The interface pattern 260 may also be formed by a CVD process, an ALD process, etc., instead of the thermal oxidation process, in this case, the interface pattern 260 may also be formed on the inner sidewalls of the first and second spacers 182, 220.

The gate electrode layer, the work function control layer, and the gate insulation layer may be planarized until the upper surface of the insulation layer 240 may be exposed to form a gate electrode 290, a work function control pattern 280, and a gate insulation pattern 270, respectively. The interface pattern 260, the gate insulation pattern 270, the work function control pattern 280, and the gate electrode 290 may form a gate structure 300.

In example embodiments, an upper surface of a portion of the gate structure 300 formed between the active region 105 and the first semiconductor pattern 126a may have a smaller length in the first direction than a lower surface thereof, an upper surface of a portion of the gate structure 300 formed between the first semiconductor pattern 126a and the second semiconductor pattern 126b may have substantially the same length in the first direction as a lower surface thereof, and an upper surface of a portion of the gate structure 300 formed between the second semiconductor pattern 126b and the third semiconductor pattern 126c may have a greater length in the first direction than a lower surface thereof. In one embodiment, the length in the first direction of the gate structure 300 may be the smallest at a central portion in the third direction of the gate structure 300 between the first semiconductor pattern 126a and the second semiconductor pattern 126b.

The fabrication of the semiconductor device may be completed by the processes described above.

Figure 18:
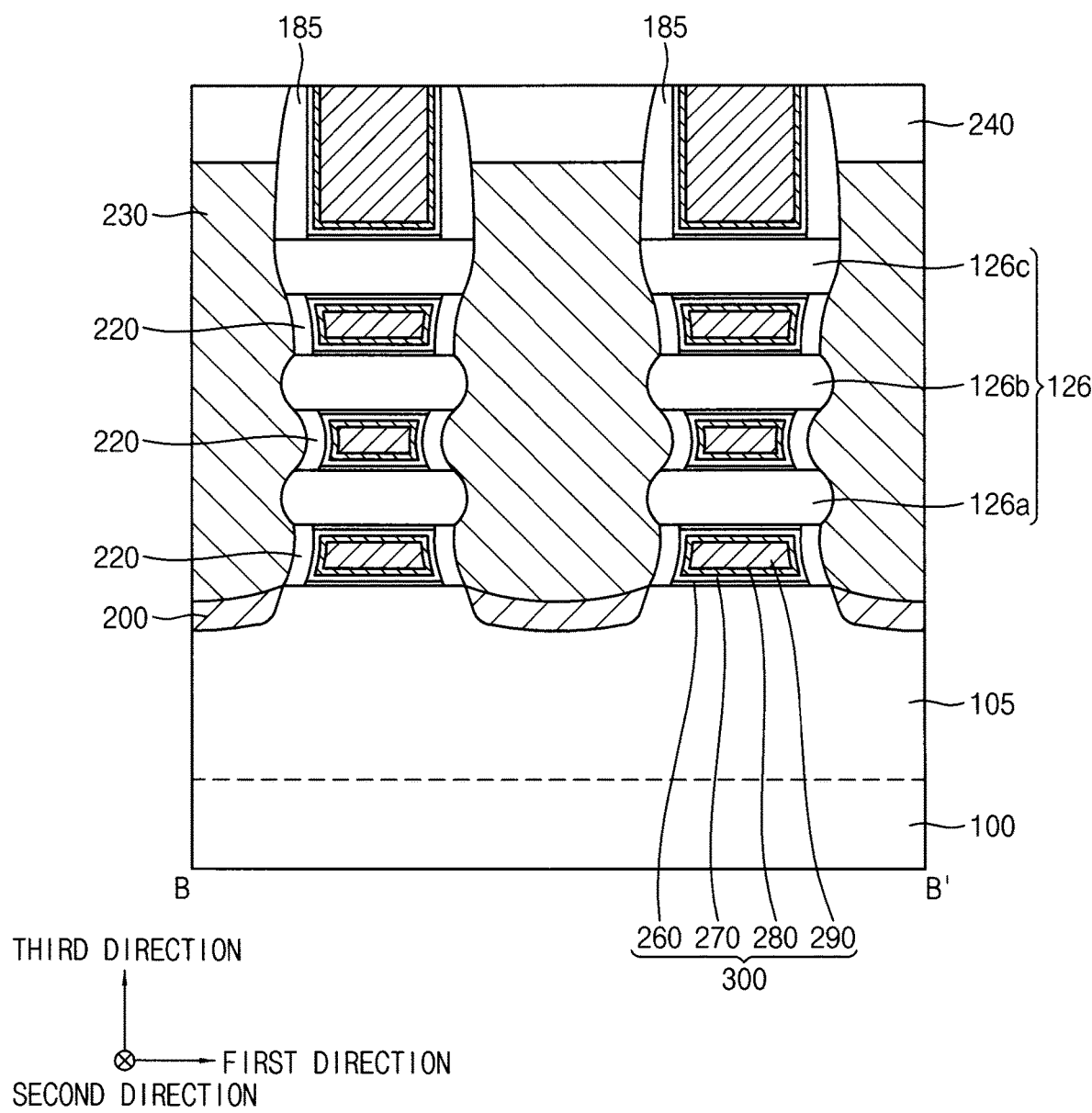
FIGS. 18 to 20 are cross-sectional views illustrating semiconductor devices in accordance with example embodiments.
Figure 19:
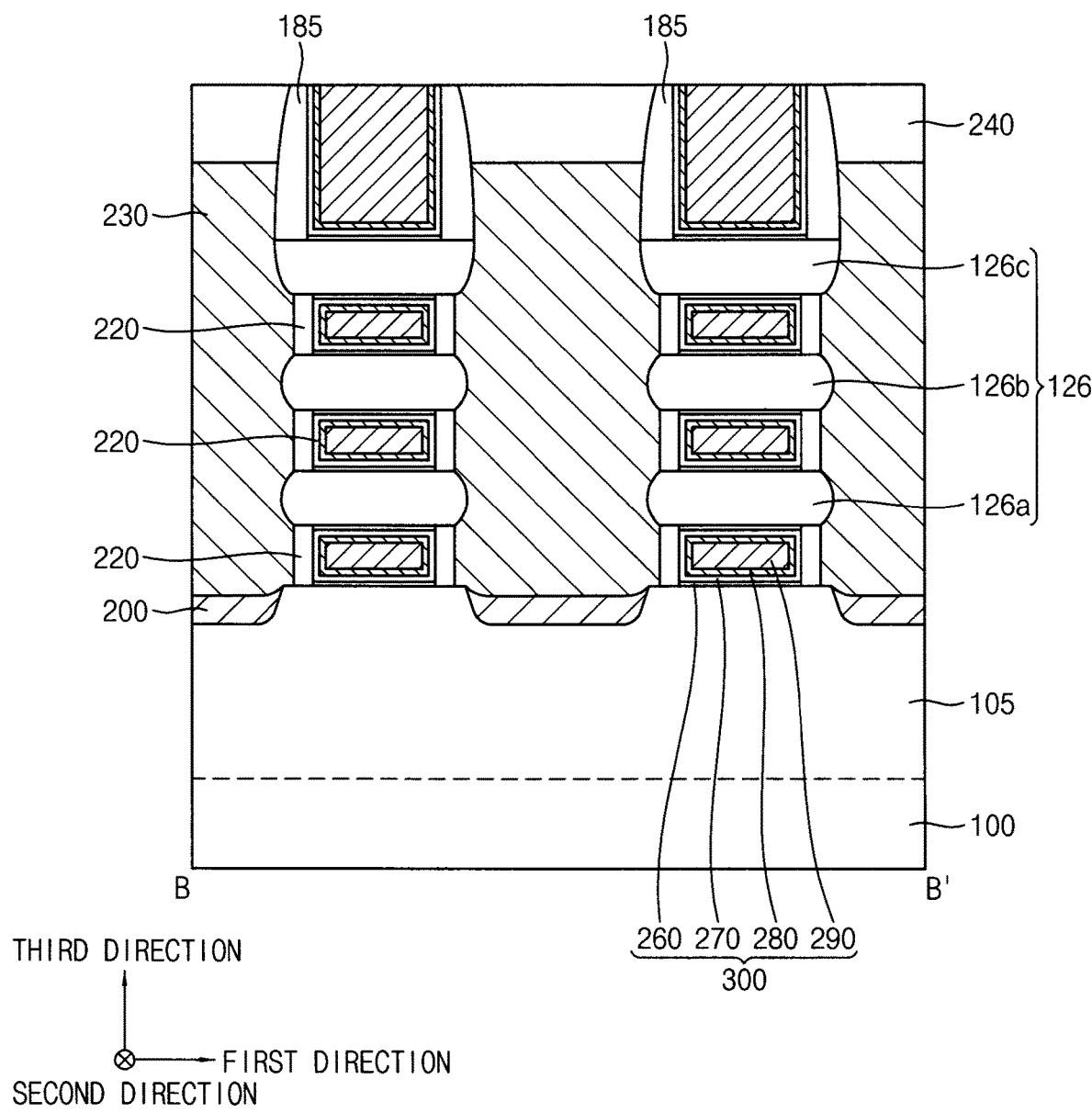
Figure 20:
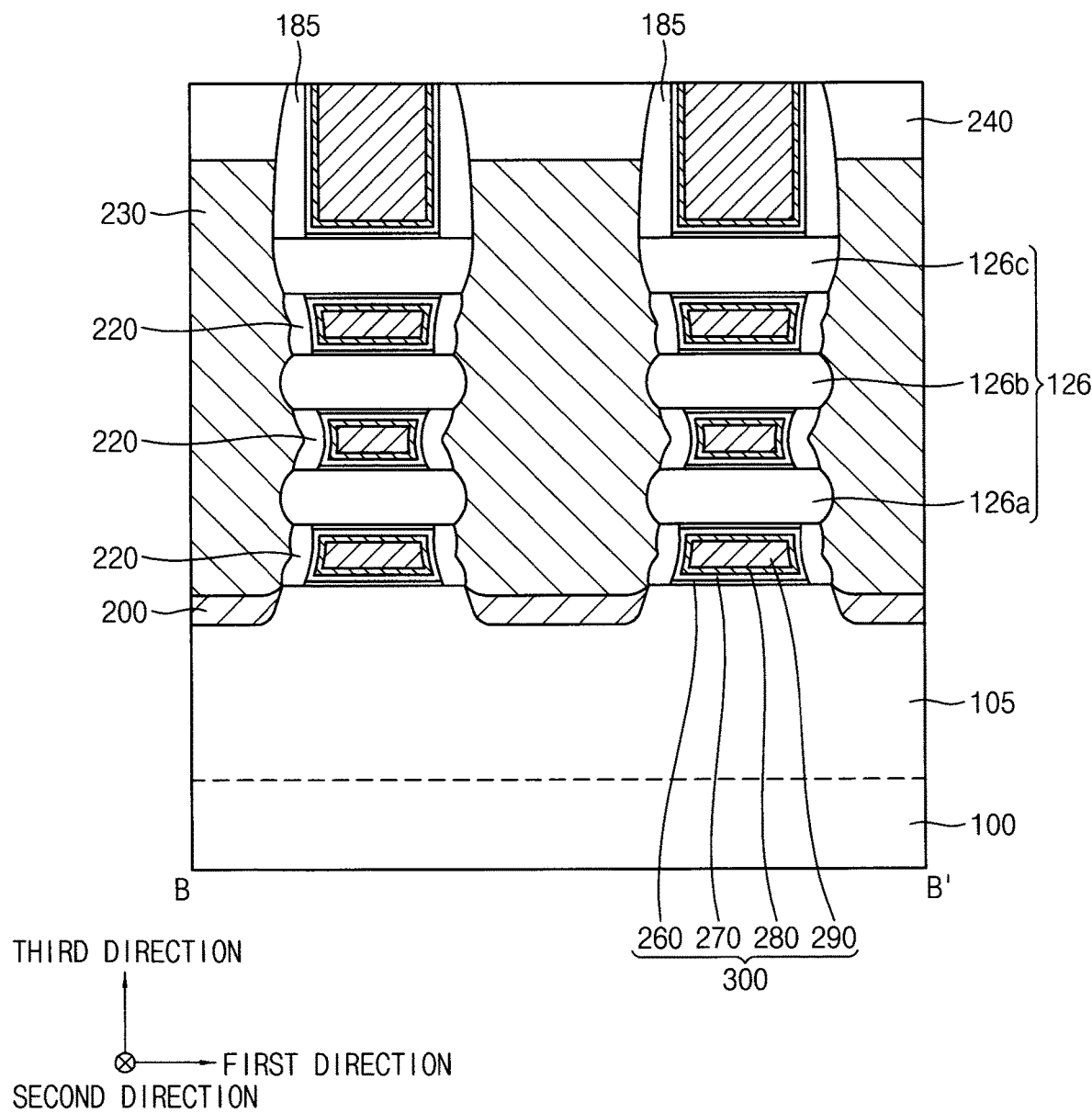

FIGS. 18 to 20 are cross-sectional views illustrating semiconductor devices in accordance with example embodiments. FIGS. 18 to 20 are cross-sectional views each taken along a line B-B' of FIG. 1.

The semiconductor devices are substantially the same as or similar to the semiconductor device described in FIGS. 1 to 3, except for shapes of the seed layer and the second spacer. Thus, like reference numerals refer to like elements, and detailed descriptions thereof are omitted herein.

Referring to FIG. 18, an upper surface and a lower surface of the seed layer 200 may have a concave shape as a whole.

Thus, a lower surface of the source/drain region 230 may also have a downwardly convex shape, corresponding to the shape of the upper surface of the seed layer 200.

Referring to FIG. 19, the second spacer 220 may have an inner sidewall and an outer sidewall each vertical to the upper surface of the substrate 100. For example, each of the second spacers 220 may have an inner sidewall and an outer sidewall on opposite sides of a respective gate structure 300 with each sidewall being vertical with respect to the upper surface of the substrate 100.

Accordingly, a sidewall of the gate structure 300 contacting the inner sidewall of the second spacer 220 and a sidewall of the gate structure 300 contacting the outer sidewall of the second spacer 220 may also be vertical to the upper surface of the substrate 100. For example, a sidewall of the respective gate structure 300 contacting the inner sidewall of the corresponding second spacer 220 and a sidewall of the respective gate structure 300 contacting the outer sidewall of the corresponding second spacer 220 may also be vertical with respect to the upper surface of the substrate 100.

Referring to FIG. 20, an inner sidewall of the second spacer 220 may have a concave shape toward a central portion in the third direction of the second spacer 220 formed between the first semiconductor pattern 126a and the second semiconductor pattern 126b, and an outer sidewall of the second spacer 220 may also have a shape similar to the inner sidewall of the second spacer, however, the outer sidewall of the second spacer 220 may have a shape in which a central portion in the third direction may be concave toward each of the gate structures 300.

Accordingly, a sidewall of the gate structure 300 contacting the inner sidewall of the second spacer 220 and a sidewall of the gate structure 300 contacting the outer sidewall of the second spacer 220 may also have shapes similar to the shapes of the inner sidewall and the outer sidewall, respectively, of the second spacer 220.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A semiconductor device, comprising:
   a substrate having a recess formed in a non-oxidized upper portion thereof;
   gate structures formed on the substrate and being spaced apart from each other in a horizontal direction that is substantially parallel to an upper surface of the substrate;
   a plurality of channels spaced apart from each other in a vertical direction substantially perpendicular to the upper surface of the substrate, each of the channels extending through each of the gate structures in the horizontal direction;
   a seed layer in the recess; and
   a source/drain region on the seed layer, the source/drain region connected to the channels,
   wherein each sidewall of the source/drain region in the horizontal direction has a concave-convex shape,
   wherein a protruding portion of the source/drain region formed between a pair of the gate structures located at the same level above the substrate in the vertical direction, protrudes in the horizontal direction compared to a non-protruding portion of the source/drain region formed between the channels, wherein the plurality of channels include a first channel at a lowermost level, a second channel at a middle level, and a third channel at an uppermost level, and wherein an upper surface of the third channel has a greater length in the horizontal direction than a lower surface thereof.

2. The semiconductor device of claim 1,
wherein the source/drain region is widest in the horizontal direction at a portion formed at a height between the first and second channels.

3. The semiconductor device of claim 1, wherein an upper surface of the second channel has substantially the same length in the horizontal direction as a lower surface thereof.

4. The semiconductor device of claim 1, wherein an upper surface of the first channel has a smaller length in the horizontal direction than a lower surface thereof.

5. The semiconductor device of claim 1, wherein at least a central portion of an upper surface of the seed layer is flat in the horizontal direction.

6. The semiconductor device of claim 5, wherein the upper surface of the seed layer is flat.

7. The semiconductor device of claim 1, wherein an upper surface of the seed layer is concave.

8. The semiconductor device of claim 1, wherein a lower surface of the seed layer is downwardly convex.

9. The semiconductor device of claim 1, wherein a height of an upper surface of the seed layer is lower than that of a lower surface of each of the gate structures.

10. The semiconductor device of claim 1, wherein the source/drain region includes silicon-germanium doped with impurities.

11. A semiconductor device, comprising:
a substrate having a recess formed in a non-oxidized upper portion thereof;
gate structures formed on the substrate and being spaced apart from each other;
a plurality of channels spaced apart from each other in a vertical direction substantially perpendicular to an upper surface of the substrate, each of the channels extending through each of the gate structures in a horizontal direction substantially parallel to the upper surface of the substrate;
a seed layer in the recess, the seed layer having a lower surface that is downwardly convex and including silicon-germanium; and
a source/drain region on the seed layer, the source/drain region being connected to the channels,
wherein the channels include a first channel at a lowermost level, a second channel at a middle level, and a third channel at an uppermost level in each of the gate structures, and wherein an upper surface of the third channel has a greater length in the horizontal direction than a lower surface thereof.

12. The semiconductor device of claim 11, wherein at least a central portion of an upper surface of the seed layer is flat.

13. The semiconductor device of claim 11, wherein each of both sidewalls of the source/drain region in the horizontal direction has a concave-convex shape.

14. The semiconductor device of claim 13, wherein a protruding portion of the source/drain region formed between the gate structures protrudes in the horizontal direction compared to a non-protruding portion of the source/drain region formed between the channels.

15. The semiconductor device of claim 14,
wherein the source/drain region is widest in the horizontal direction at a portion formed at a height between the first and second channels.

16. A semiconductor device, comprising:
a substrate having a recess formed in a non-oxidized upper portion thereof;
gate structures formed on the substrate and being spaced apart from each other in a horizontal direction substantially parallel to an upper surface of the substrate;
a plurality of channels spaced apart from each other in a vertical direction substantially perpendicular to the upper surface of the substrate, each of the channels extending through each of the gate structures in the horizontal direction;
a seed layer in the recess, the seed layer including silicon-germanium; and
a source/drain region on the seed layer, the source/drain region being connected to the channels and having a variable width in the horizontal direction that varies along the vertical direction,
wherein the plurality of channels include a first channel at a lowermost level, a second channel at a middle level, and a third channel at an uppermost level, and
wherein an upper surface of the third channel has a greater length in the horizontal direction than a lower surface thereof.

17. The semiconductor device of claim 16, wherein a first width of a first portion of the source/drain region formed between a first pair of gate structures spaced apart from each other in the horizontal direction and located at the same level in the vertical direction is different from a second width of a second portion of the source/drain region formed between a second pair of gate structures spaced apart from each other in the horizontal direction and located at the same level in the vertical direction, and
wherein the first width of the first portion of the source/drain region and the second width of the second portion of the source/drain region are greater than a width of a portion of the source/drain region formed between the channels.

* * * * *